(12) United States Patent
Kim et al.

(10) Patent No.: US 9,035,340 B2
(45) Date of Patent: May 19, 2015

(54) RED PHOSPHOR, METHOD FOR PREPARING SAME, AND LIGHT-EMITTING DEVICE COMPRISING SAME

(75) Inventors: Do Hwan Kim, Gwangju-Si (KR); Jeong Ho Ryu, Suwon-Si (KR); Sang Hyun Kim, Seoul (KR); Chul Soo Yoon, Suwon-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 115 days.

(21) Appl. No.: 13/825,275

(22) PCT Filed: Sep. 20, 2011

(86) PCT No.: PCT/KR2011/006928
§ 371 (c)(1),
(2), (4) Date: Jun. 3, 2013

(87) PCT Pub. No.: WO2012/039572
PCT Pub. Date: Mar. 29, 2012

(65) Prior Publication Data
US 2013/0248909 A1      Sep. 26, 2013

(30) Foreign Application Priority Data
Sep. 20, 2010    (KR) .............................. 2010-0092633

(51) Int. Cl.
*H01L 33/00*    (2010.01)
*H01L 33/50*    (2010.01)
*C09K 11/77*    (2006.01)
*H05B 33/14*    (2006.01)

(52) U.S. Cl.
CPC .......... *H01L 33/504* (2013.01); *C09K 11/7734* (2013.01); *H01L 33/502* (2013.01); *H05B 33/14* (2013.01); *H01L 2224/48091* (2013.01)

(58) Field of Classification Search
USPC .................................................... 257/98, 100
See application file for complete search history.

(56) References Cited

U.S. PATENT DOCUMENTS

2006/0145123 A1    7/2006    Li et al.
2010/0187974 A1    7/2010    Zhang et al.
2014/0008680 A1*   1/2014    Won et al. ........................ 257/98

FOREIGN PATENT DOCUMENTS

CN    101029230 A    9/2007
CN    101195744 A    6/2008
(Continued)

OTHER PUBLICATIONS

Chinese Office Action, w/ English translation thereof, issued in Chinese Patent Application No. CN 201180055806.5 dated Mar. 7, 2014.
(Continued)

*Primary Examiner* — Tan N Tran
(74) *Attorney, Agent, or Firm* — McDermott Will & Emery LLP

(57) ABSTRACT

Provided is a red phosphor having superior thermal and chemical stability and excellent luminous efficiency, wherein the red phosphor comprises a compound expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K) and sodium (Na), M is at least one element selected from a group consisting of barium (Ba), magnesium (Mg), and calcium (Ca), and R is at least one element selected from a group consisting of lanthanide and a transition metal element.

29 Claims, 33 Drawing Sheets

(56) References Cited

FOREIGN PATENT DOCUMENTS

| | | |
|---|---|---|
| CN | 101331578 A | 12/2008 |
| CN | 101671562 A | 3/2010 |
| CN | 101696353 A | 4/2010 |
| JP | 2007-070445 A | 3/2007 |
| JP | 2007-231245 A | 9/2007 |
| JP | 2009-616030 A | 4/2009 |
| WO | WO-2007/041402 A2 | 4/2007 |
| WO | WO-2007/056311 A2 | 5/2007 |

OTHER PUBLICATIONS

Q. Yanmin et al., "Photoluminescent properties of Sr2SiO4:Eu3+ and Sr2SiO4:Eu2+ phosphors prepared by solid-state reaction method," Journal of Rare Earths, vol. 27, No. 2, Apr. 2009, pp. 323-326.

Kee-Sun Sohn et al., "Luminescence of Sr2SiO4-xN2x/3:Eu2+ Phosphors Prepared by Spark Plasma Sintering," Journal of the Electrochemical Society, 155 (2) J58-J61 (2008).

English abstract of "Research Progress in Silicon-based (oxy) Nitride Phosphors for White LED," China Journals Full-text Database; Retrieved on May 19, 2014.

* cited by examiner

RED PHOSPHOR, METHOD FOR PREPARING SAME, AND LIGHT-EMITTING DEVICE COMPRISING SAME

CROSS-REFERENCE TO RELATED APPLICATIONS

This application is the U.S. National Stage of International Application No. PCT/KR2011/006928, filed Sep. 20, 2011, and claims benefit of priority to Korean Patent Application No. 10-2010-0092633 filed on Sep. 20, 2010, in the Korean Intellectual Property Office, the entire contents of which are hereby incorporated by reference.

TECHNICAL FIELD

A red phosphor, a method for preparing the same, and a light-emitting device including the same are disclosed. More particularly, a red phosphor showing excellent light-emitting characteristics and thermal and chemical stability, a method for preparing the same, and a light-emitting device including the same are disclosed.

BACKGROUND

Light emitting diodes (LEDs) show high reliability, have low maintenance and repair costs due to long service life, and have low power consumption as compared to existing lighting instruments, and thus may greatly contribute to energy savings. Further, since it is easy to apply various designs and heat generation is low as a lighting device, an LED has very favorable conditions when the LED is used as illumination.

A fluorescent material used in a device including these LEDs, and the like is a material which converts light with a specific wavelength from various light sources into light with a desired wavelength, and is a core technology for manufacturing a white LED. In addition, the efficiency of the fluorescent material is an essential factor in driving a display and serves as a major parameter which is directly associated with the efficiency of a light source product including the display. Recently, a technology for implementing white light close to natural light as defined in CIE color coordinates, has been under development, and studies on a white LED device for emitting the white light have been actively conducted.

In general, a white LED is manufactured in a manner where one or more phosphors selected from phosphors of red, blue, yellow and the like are applied to blue or ultraviolet LED chips. In particular, when a red phosphor and a phosphor of another color are used in combination, in the case of a low half bandwidth of each phosphor, it is difficult to secure a sufficient color rendering index and there is a limitation in implementing desired natural white light.

Furthermore, since the red phosphor in the related art shows a relatively low half bandwidth, and shows a light emission peak at a wavelength band from 550 nm to 700 nm, it is difficult to show a sufficient color rendering property. Accordingly, in a white LED, there is a need for developing a red phosphor, which has excellent luminous efficiency and may implement a sufficient color rendering property.

SUMMARY

The present teachings relates to a red phosphor having high luminance and showing excellent thermal and chemical stability, a method for preparing the same, and a light-emitting device including the same.

A red phosphor according to an example of the present application is a red phosphor including a compound expressed in a composition formula: $A_z(Sr, M)_2(Si, Al)O_{4-x}N_y$ ($0<x<3$, $y=2x/3$, $0.001<z<0.1$), where A is at least one element selected from a group consisting of lithium (Li), potassium (K), and sodium (Na) and M is at least one element selected from a group consisting of barium (Ba), magnesium (Mg), and calcium (Ca).

According to an aspect, A may be sodium (Na), and M may be calcium (Ca).

According to an aspect, the compound expressed as $A_z(Sr, M)_2(Si, Al)O_{4-x}N_y$:R($0<x<3$, $y=2x/3$, $0.001<z<0.1$) may include a host material having a crystal phase, and A may be included as a dopant material or activator in the compound.

According to an aspect, the compound expressed as $A_z(Sr, M)_2(Si, Al)O_{4-x}N_y$:R($0<x<3$, $y=2x/3$, $0.001<z<0.1$) may include a host material having a crystal phase, and A and aluminum (Al) may be included as a dopant material or activator in the compound.

According to an aspect, the red phosphor may have a light emission peak at a wavelength band from 600 nm to 700 nm by using a blue or ultraviolet wavelength region as an excitation source.

According to an aspect, the red phosphor may further include europium (Eu) or dysprosium (Dy) as an activator.

According to an aspect, a spectrum half bandwidth of a light emission wavelength of the red phosphor may be from 83 nm to 150 nm.

According to an aspect, the crystal structure may be an orthorhombic crystal structure.

In accordance with another example, a method for preparing a red phosphor is provided. The method includes a mixing step of mixing raw materials including at least one compound of an Sr-containing compound and an M-containing compound, an A-containing compound, an Eu-containing compound, an Al-containing compound, an Si-containing oxide, and an Si-containing nitride. A sintering step sinters the mixture to obtain a compound expressed in a composition formula: $A_z(Sr, M)_2(Si, Al)O_{4-x}N_y$:Eu($0<x<3$, $y=2x/3$, $0.001<z<0.1$). A milling step crushes and mills the sintered compound, where A is at least one element selected from a group consisting of lithium (Li), potassium (K), and sodium (Na), and M is at least one element selected from a group consisting of barium (Ba), magnesium (Mg) and calcium (Ca).

According to an aspect, the sintering step and milling step may be performed twice, respectively.

According to an aspect, the Eu-containing compound may be europium oxide ($Eu_2O_3$).

According to an aspect, in the mixing step, manganese carbonate may be further mixed.

According to an aspect, the Sr-containing compound may include a metal, a water soluble metal salt, an oxide, a nitrate, an oxide salt, a sulfate, or a carbonate of strontium (Sr).

According to an aspect, the M-containing compound may include a metal, a water soluble metal salt, an oxide, a nitrate, an oxide salt, a sulfate, or a carbonate of M.

According to an aspect, the Si-containing oxide may be silicon oxide ($SiO_2$), and the Si-containing nitride may be silicon nitride ($Si_3N_4$).

According to an aspect, in the mixing step, the raw materials may be wet-mixed by using a solvent.

According to an aspect, the method may further include: drying the mixture subjected to the mixing step.

According to an aspect, the sintering may be performed in a temperature range from 1,000° C. to 1,800° C. for 1 to 24 hours.

According to an aspect, the sintering may be performed under a nitrogen gas atmosphere.

According to yet another aspect, a light-emitting device is provided. The device includes a light-emitting element emitting excitation light. A wavelength conversion unit absorbs the excitation light to emit visible light, in which the wavelength conversion unit includes a compound expressed in a composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element.

According to an aspect, the red phosphor may emit a light emission peak at a wavelength band from 600 nm to 700 nm by using a blue or ultraviolet wavelength region as an excitation source.

According to an aspect, the light-emitting element may be an ultraviolet light-emitting diode or blue light-emitting diode.

According to an aspect, the light-emitting device may include at least one phosphor selected from a group consisting of a blue phosphor, a green phosphor, and a yellow phosphor, and final output light of the light-emitting device may be white light.

According to an aspect, the wavelength conversion unit may have a multilayer-structure which is formed on an upper portion of the light-emitting element and includes at least two phosphor layers including phosphors different from each other.

According to an aspect, the phosphor may be at least one selected from a group consisting of a blue phosphor, a green phosphor, and a yellow phosphor, and final output light of the light-emitting device may be white light.

According to an aspect, the wavelength conversion unit may be formed such that an outer surface of the light-emitting element is uniformly covered with a resin including the red phosphor.

According to an aspect, the wavelength conversion unit may be formed only on an upper surface of the light-emitting element, or on upper and side surfaces thereof.

According to an aspect, the wavelength conversion unit may further include a resin packaging unit encapsulating the light-emitting element, and the red phosphor may be dispersed in the resin packaging unit.

According to an aspect, the wavelength conversion unit may include at least two phosphors selected from a group consisting of a blue phosphor, a green phosphor, and a yellow phosphor, and final output light of the light-emitting device may be white light.

According to the present teachings, a red phosphor is provided which may emit red light with a long wavelength, which has high light-emitting characteristics and excellent thermal and chemical stability. Further, provided is a light-emitting device which has high output/high reliability and emits white light close to natural light using blue and ultraviolet wavelength bands as an excitation source by including the red phosphor.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF DRAWINGS

The above and other aspects, features and other advantages of the present application will be more clearly understood from the following detailed description taken in conjunction with the accompanying drawings, in which:

FIGS. 43 and 44 illustrate partial structures of the light-emitting element packages according to seventh and eighth examples.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

A red phosphor according to the present invention includes a compound expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element.

Figure 1:
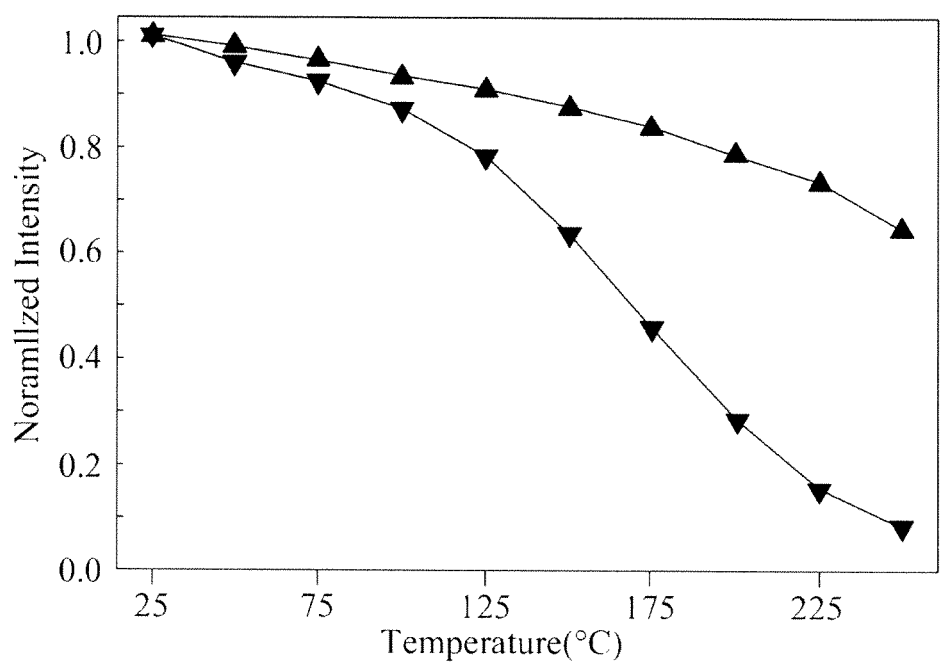
FIG. 1 is a graph showing qualities (T/Q characteristics) of an existing silicate-based phosphor and a nitride phosphor of the present application according to the temperature.

When the red phosphor according to the present application is included in various lighting devices such as a light emitting diode (LED), and the like by including a nitride phosphor expressed in the composition formula: $A_z(Sr, M)_2(Si, Al)O_{4-x}N_y:R$ ($0<x<3$, $y=2x/3$, $0.001<z<0.1$), the red phosphor according to the present application exhibits a high luminance improvement performance by 20% or more than a red phosphor such as a silicate-based phosphor in the related art, and the like, while showing excellent thermal and chemical stability. FIG. 1 illustrates a graph showing qualities (T/Q characteristics) of the existing silicate-based phosphor and the nitride phosphor of the present application according to the temperature.

Figure 3:
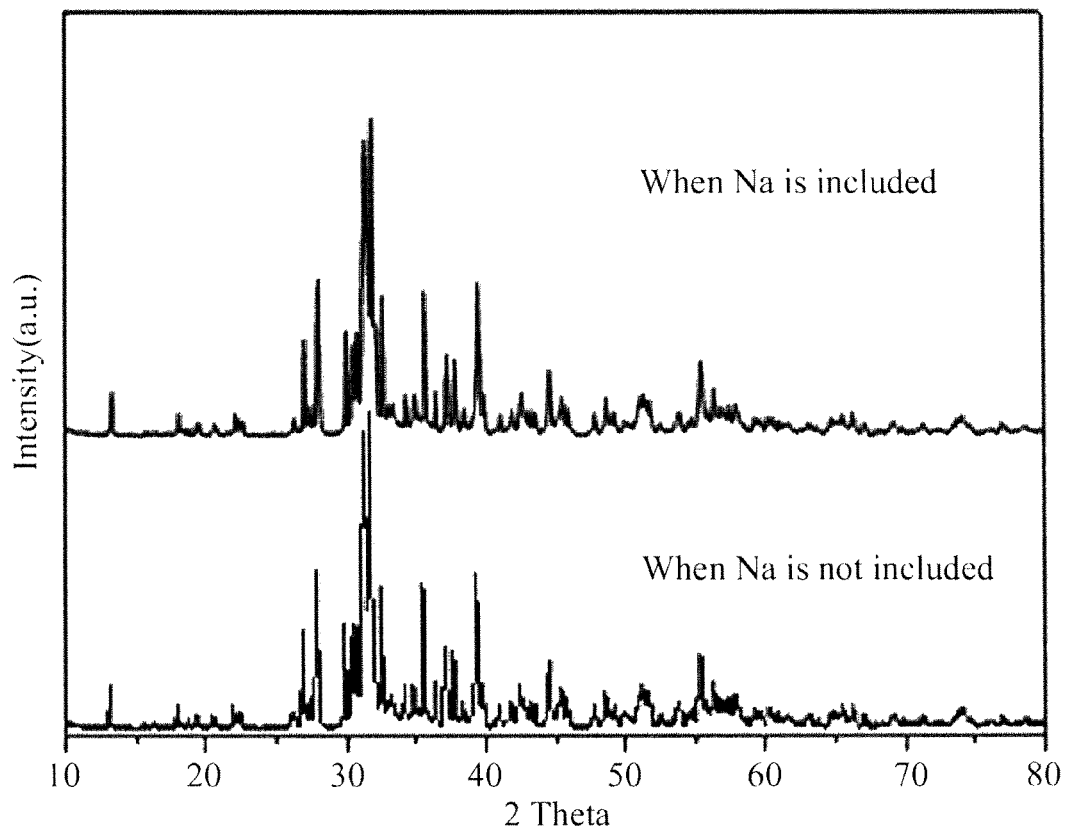
FIG. 3 is a graph showing the X-ray diffraction analysis results of the crystal phases of the phosphor according to an example of the present application and of a nitride-based red phosphor which does not include sodium, calcium, and aluminum.

A may be sodium (Na) and M may be calcium (Ca) in the compound expressed as $A_z(Sr, M)_2(Si, Al)O_{4-x}N_y:R$ ($0<x<3$, $y=2x/3$, $0.001<z<0.1$). Sodium and calcium are included in an empty sphere to be formed in a matrix of the compound while not affecting the form of a matrix which is a host material of the crystal phase of the compound, and thus serve to improve the luminance of the phosphor. FIG. 3 discloses a graph showing the X-ray diffraction analysis results of the crystal phases of the phosphor according to an example of the present application and of a nitride-based red phosphor which does not include sodium, calcium, and aluminum.

The compound expressed as $A_z(Sr, M)_2(Si, Al)O_{4-x}N_y:R$ ($0<x<3$, $y=2x/3$, $0.001<z<0.1$) may be prepared in combination of various constitutions for improving the performance of a light-emitting body by being prepared such that an element constituting A, an element constituting M, and aluminum (Al) may perform various roles such as a host material or dopant material having a crystal phase, an activator, or the like, respectively.

Figure 2:
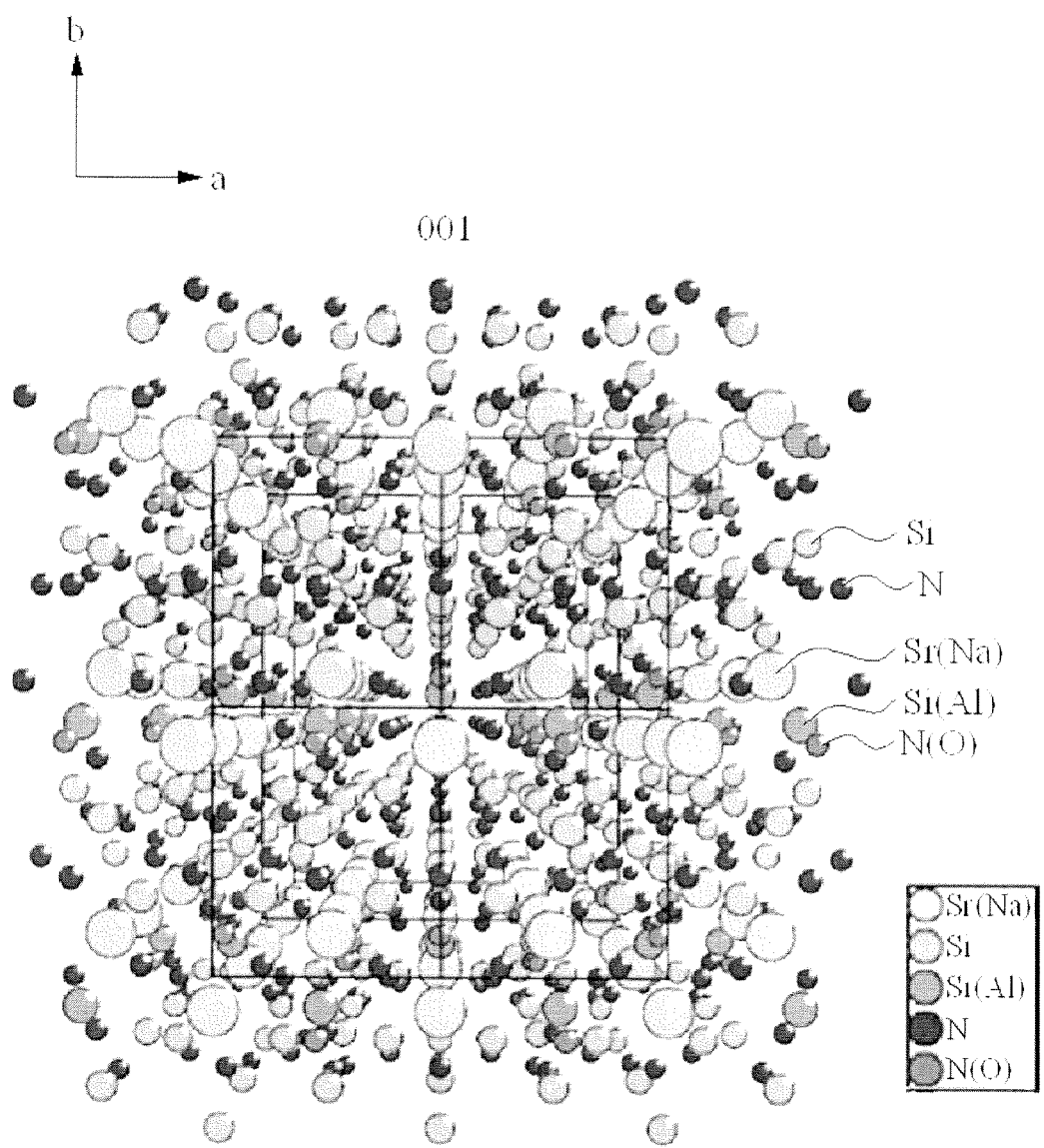
FIG. 2 is a schematic view illustrating a crystal phase of the red phosphor according to an example of the present application.

For example, the compound expressed as $A_z(Sr, M)_2(Si, Al)O_{4-x}N_y:R(0<x<3, y=2x/3, 0.001<z<0.1)$ may include a host material having a crystal phase, and A may be included as a dopant material or activator in the compound. Further, the compound expressed as $A_z(Sr, M)_2(Si, Al)O_{4-x}N_y:R(0<x<3, y=2x/3, 0.001<z<0.1)$ may include a host material having a crystal phase, and A and aluminum (Al) may be included as a dopant material or activator in the compound. FIG. 2 illustrates a schematic view showing a crystal phase of the red phosphor according to an example of the present application.

R is an activator which is lanthanide or a transition metal element, and may be, for example, europium (Eu) or dysprosium (Dy), and a red phosphor including the europium (Eu) or dysprosium (Dy) as an activator may emit red light having a light emission peak at a wavelength band from 600 nm to 700 nm from an excitation source at a blue or ultraviolet wavelength region.

For the spectrum half bandwidth of the light emission wavelength of the red phosphor, it is possible to use a red phosphor having a band width preferably in a range from 83 nm to 150 nm. A red phosphor showing a half bandwidth in the range may show a high color rendering property in a light-emitting device such as a white light-emitting device and the like.

In addition, it is preferred that the red phosphor may be easily manufactured and show thermal and chemical stability by having an orthorhombic crystal structure which is the same as that of a strontium silicate ($Sr_2SiO_4$) phosphor in the related art.

The present application also provides a method for preparing a red phosphor, including; a mixing step of mixing raw materials including at least one compound of an Sr-containing compound and an M-containing compound, an A-containing compound, an Eu-containing compound, an Al-containing compound, an Si-containing oxide, and an Si-containing nitride; a sintering step of sintering the mixture to obtain a compound expressed in the composition formula: $A_z(Sr, M)_2(Si, Al)O_{4-x}N_y:Eu(0<x<3, y=2x/3, 0.001<z<0.1)$; and a milling step of crushing and milling the sintered compound, where A is at least one element selected from a group consisting of lithium (Li), potassium (K), and sodium (Na), and M is at least one element selected from a group consisting of barium (Ba), magnesium (Mg) and calcium (Ca).

That is, the method for preparing a red phosphor according to the present application includes mixing raw materials including at least one compound of an Sr-containing compound and an M-containing compound, an A-containing compound, an Eu-containing compound, an Al-containing compound, an Si-containing oxide, and an Si-containing nitride. The mixture is sintered to obtain a compound expressed in the composition formula: $A_z(Sr, M)_2(Si, Al)O_{4-x}N_y:Eu(0<x<3, y=2x/3, 0.001<z<0.1)$ and milling the compound, thereby easily preparing a red phosphor having excellent thermal and chemical stability and showing high luminance.

In preparing the red phosphor, the sintering step and the milling step may be performed only once, respectively, but may be performed twice or more, respectively. It is possible to prepare a red phosphor with thermal and chemical stability and light emitting performance further improved by subjecting the red phosphor to the sintering step and the milling step twice or more.

The Eu-containing compound may be europium oxide ($Eu_2O_3$), and may be further mixed with manganese carbonate in the mixing step of mixing the raw materials. Manganese included in the manganese carbonate further increases the light emission intensity of europium included in the europium oxide which is an active material.

The Sr-containing compound is a compound including various additives which allow the phosphor to be easily prepared, and may include, for example, a metal, a water soluble metal salt, an oxide, a nitrate, an oxide salt, a sulfate, or a carbonate of strontium (Sr). Furthermore, the M-containing compound may include a metal, a water soluble metal salt, an oxide, a nitrate, an oxide salt, a sulfate, or a carbonate of M. Further, the Si-containing oxide may use, for example, silicon oxide ($SiO_2$), and the Si-containing nitride may use, for example, silicon nitride ($Si_3N_4$).

Meanwhile, the mixing step of mixing the raw materials may be performed as wet mixing of raw materials using a solvent, and may further include drying the wet-mixed raw material mixture. In addition, the sintering may be performed in a temperature range from 1,000° C. to 1,800° C. for 1 to 24 hours, and the sintering may be performed under a nitrogen gas atmosphere.

Figure 11:
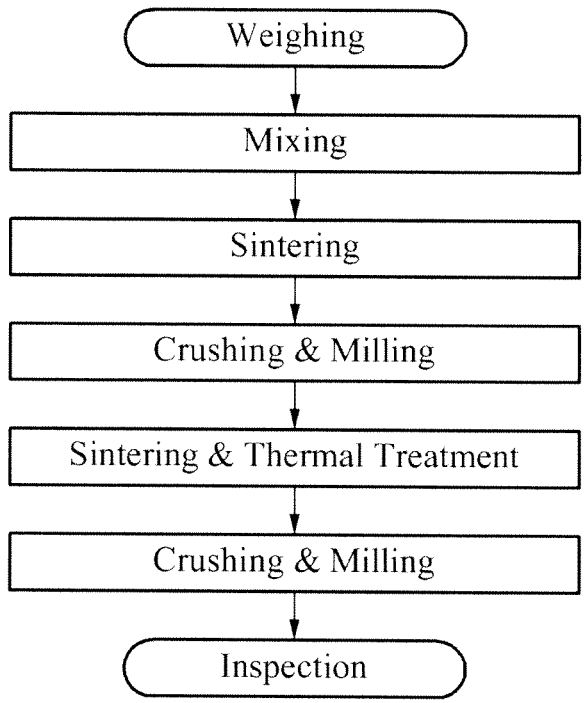
FIG. 11 is a flow chart illustrating the preparing process of the phosphor according to an example of the present application.

FIG. 11 discloses a flow chart illustrating the preparing process of the phosphor according to an example of the present application.

The present application also provides a light-emitting device including a light-emitting element emitting excitation light. A wavelength conversion unit absorbs the excitation light to emit visible light, in which the wavelength conversion unit includes a compound expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element.

The light-emitting device according to the present application may have high output/high reliability and show a performance of emitting white light close to natural light by using a blue and ultraviolet wavelength band as an excitation source by including a compound expressed in the composition formula: $A_z(Sr, M)_2(Si, Al)O_{4-x}N_y:R$ ($0<x<3$, $y=2x/3$, $0.001<z<0$).

As the red phosphor, it is possible to use a red phosphor having a wavelength band from 600 nm to 700 nm preferably by using a blue or ultraviolet wavelength region as an excitation source. Further, the light-emitting element is widely used as a light-emitting source of a light-emitting diode, and an ultraviolet light-emitting diode or blue light-emitting diode, which has a low price and shows a stable performance, may be used.

In addition, the light-emitting device is a white light-emitting device, and may be manufactured as a light-emitting device, which includes at least one phosphor selected from a group consisting of a blue phosphor, a green phosphor, and a yellow phosphor in a portion of the light-emitting device, such as an element package, and of which final output light is white light.

The wavelength conversion unit of the light-emitting device may be formed with various positions and configurations in the light-emitting device, and for example, may be formed as a wavelength conversion unit with a multilayered structure, which is formed on an upper portion of the light-emitting element and includes at least two phosphor layers including phosphors different from each other. In this case, the phosphor which may be included in the wavelength conversion unit of the multilayered structure may be formed as a phosphor, which is at least one selected from a group consisting of a blue phosphor, a green phosphor, and a yellow phosphor, and in which final output light of the light-emitting device is white light.

The wavelength conversion unit may include a structure formed such that an outer surface of the light-emitting element is uniformly covered with a resin including the red phosphor. The wavelength conversion unit may be formed, for example, only on an upper surface of the light-emitting element, or on upper and side surfaces thereof.

Furthermore, the wavelength conversion unit may be formed to have a structure, which further includes a resin packaging unit encapsulating the light-emitting element, and in which the red phosphors dispersed in the resin packaging unit. Here, the wavelength conversion unit may be formed as a wavelength conversion unit, which includes at least two phosphors selected from a group consisting of a blue phosphor, a green phosphor and a yellow phosphor, and in which final output light of the light-emitting device is white light.

Hereinafter, examples according to the present application will be described in detail. However, the present application is not limited to the examples.

Example 1

$SrCO_3$, $SiO_2$, $Eu_2O_3$, and $Si_3N_4$ as raw materials were mixed with an ethanol solvent at a stoichiometric ratio by using a ball mill. Next, the ethanol solvent was evaporated from the raw material mixture by using a dryer. The thus-dried raw material mixture was filled in a boron nitride crucible. Then, 0.01% by mole of sodium, 0.2% by mole of calcium, and 0.2% by mole of aluminum were added as doping elements to the boron nitride crucible such that the doping elements were able to be mixed with the raw material mixture.

Thereafter, the boron nitride crucible in which the raw material mixture and the doping elements were filled was inserted into a heating furnace and subjected to a sintering process of sintering the raw material mixture and doping elements at 1,600° C. in a gas state under $N_2$ atmosphere for 10 hours to obtain a compound of $Na_{0.01}(Sr, Ca)_2(Si, Al)O_{4-x}N_y:Eu$. The compound of $Na_{0.01}(Sr, Ca)_2(Si, Al)O_{4-x}N_y:Eu$ was subjected to a milling process in which crushing and milling were performed for 12 hours by using a milling machine to obtain a compound of $Na_{0.01}(Sr, Ca)_2(Si, Al)O_{4-x}N_y:Eu$ again.

The thus-obtained compound of $Na_{0.01}(Sr, Ca)_2(Si, Al)O_{4-x}N_y:Eu$ was subjected to the sintering process and the milling process under the same conditions to obtain a final phosphor of $Na_{0.01}(Sr, Ca)_2(Si, Al)O_{4-x}N_y:Eu$.

Example 2

A phosphor was prepared in the same manner as in Example 1 except that 0.01% by mole of sodium, 0.4% by mole of calcium, and 0.4% by mole of aluminum were used as doping elements.

Example 3

A phosphor was prepared in the same manner as in Example 1, except that 0.01% by mole of sodium, 0.6% by mole of calcium, and 0.6% by mole of aluminum were used as doping elements.

Comparative Example 1

A phosphor was prepared in the same manner as in Example 1, except that sodium was not used as a doping element.

The X and Y color coordinates, wavelengths, half bandwidths, and luminance for phosphors in Examples and Comparative Examples are shown in the following Table 1.

TABLE 1

| Item | X color coordinate | Y color coordinate | Wavelength | Spectrum half bandwidth | Luminance (%) |
|---|---|---|---|---|---|
| Not including Na | 0.6278 | 0.3712 | 616 | 83 | 90.49 |
| 0.01% by mole of Na and 0.2% by mole of Ca and Al, respectively | 0.6301 | 0.3700 | 620.6 | 84.2 | 113.46 |
| 0.01% by mole of Na and 0.4% by mole of Ca and Al, respectively | 0.6299 | 0.3699 | 621.5 | 83.9 | 109.54 |
| 0.01% by mole of Na and 0.6% by mole of Ca and Al, respectively | 0.6332 | 0.3659 | 628.9 | 88.7 | 103.21 |

Referring to Table 1, it can be known that the phosphor according to the present application shows excellent performance in wavelength, half bandwidth, and luminance as compared to the light-emitting body in Comparative Example.

Figure 4:
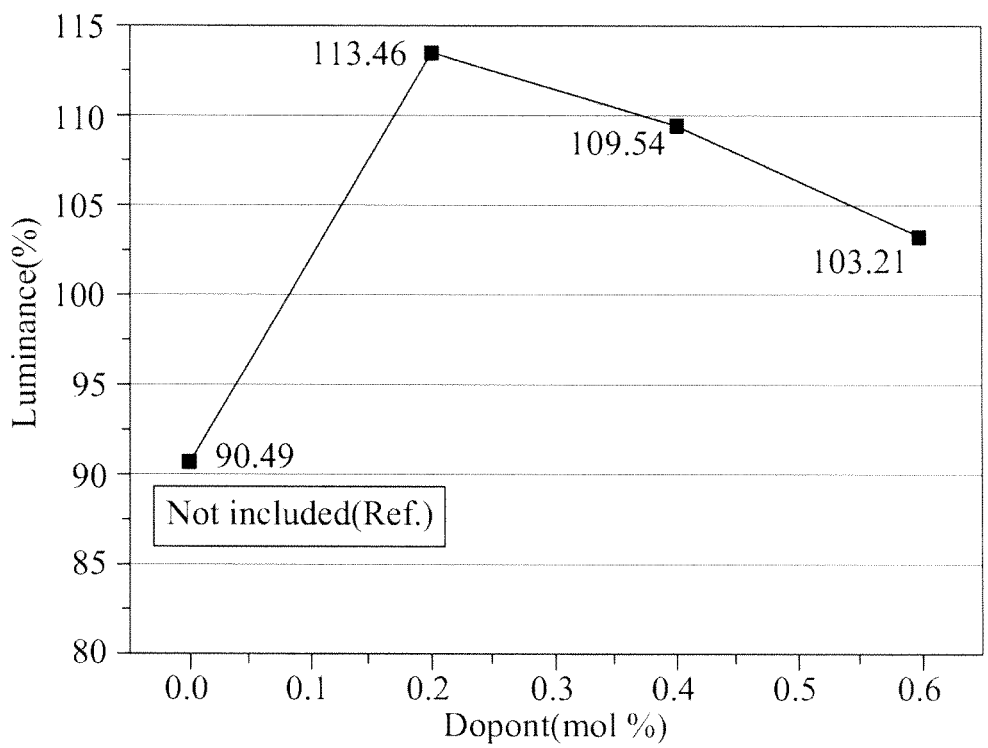
FIG. 4 is a graph for the luminance of the red phosphor according to the concentration of a sodium element, a calcium element, and an aluminum element.
Figure 5:
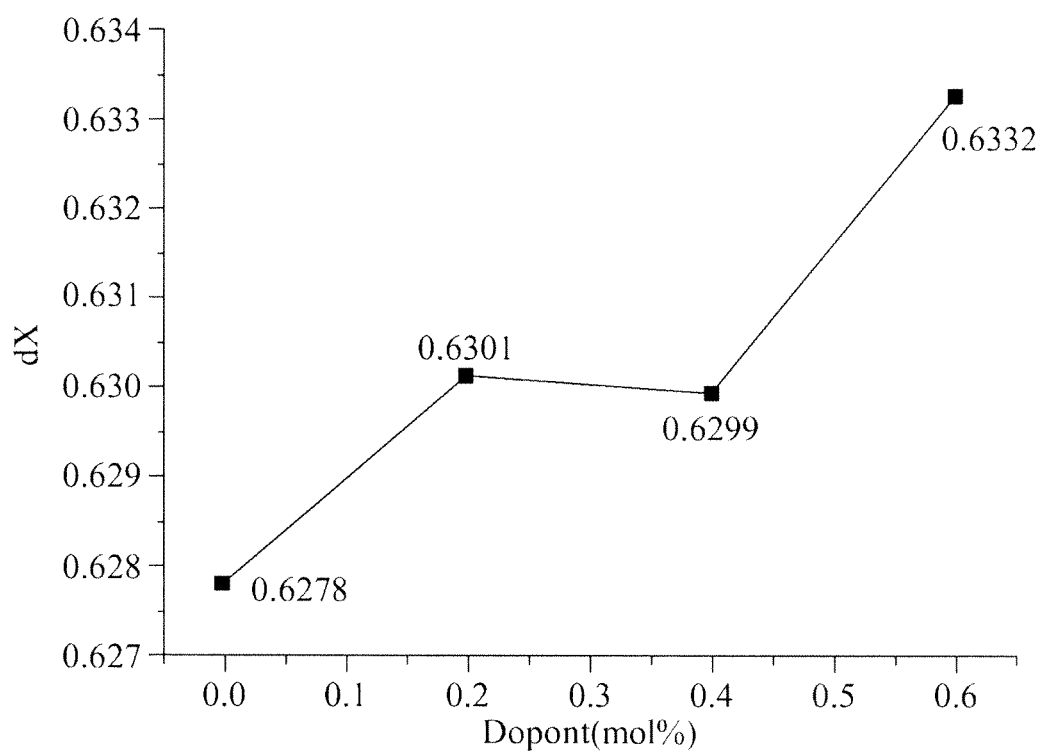
FIG. 5 is a graph for the X color coordinate values of the red phosphor according to the concentration of a sodium element, a calcium element, and an aluminum element.
Figure 6:
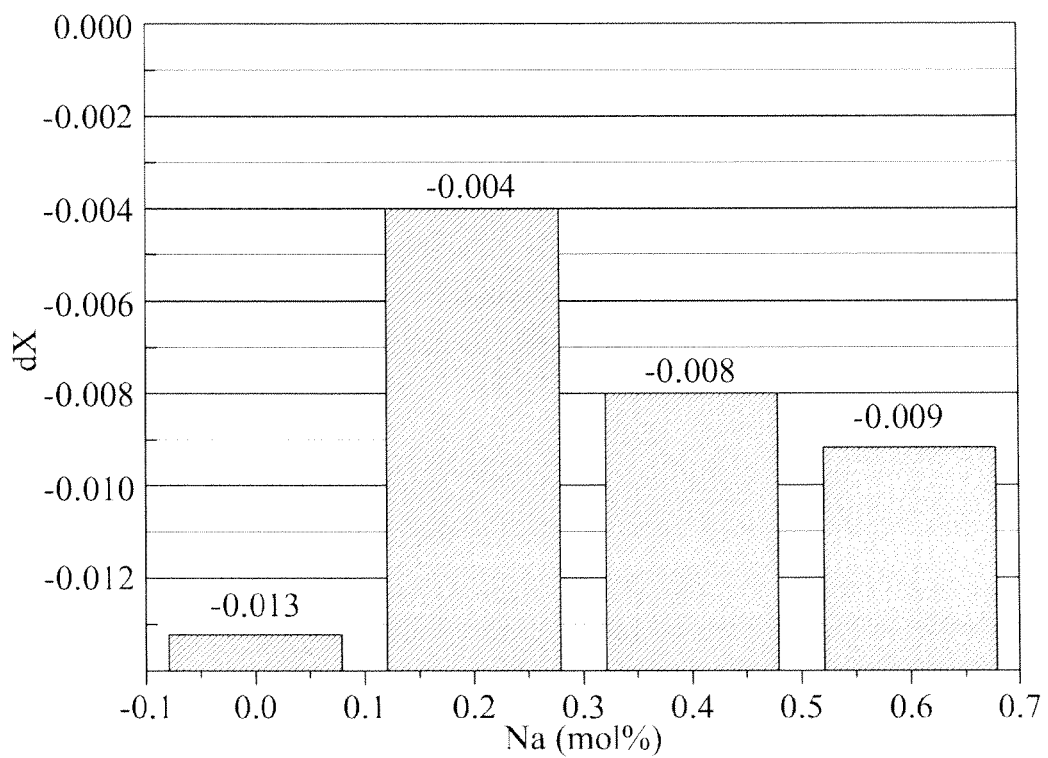
FIG. 6 is a graph showing the variation in X color coordinate values of the red phosphor according to the concentration of a sodium element, a calcium element, and an aluminum element.

FIG. 4 illustrates a graph of the luminance for the red phosphor according to the concentration of a sodium element, a calcium element, and an aluminum element. FIG. 5 illustrates a graph for the X color coordinate values of the red phosphor according to the concentration of a sodium element, a calcium element, and an aluminum element, and FIG. 6 illustrates the variation in X color coordinate values of the red phosphor according to the concentration of a sodium element, a calcium element, and an aluminum element.

Figure 7:
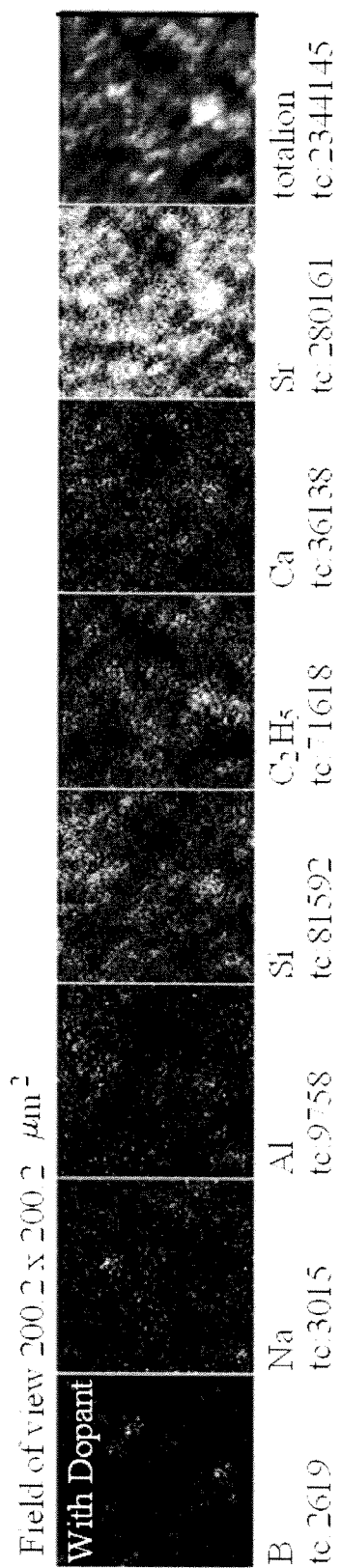
FIG. 7 is an electron micrograph for the surfaces of phosphors which include various kinds of doping elements.
Figure 8:
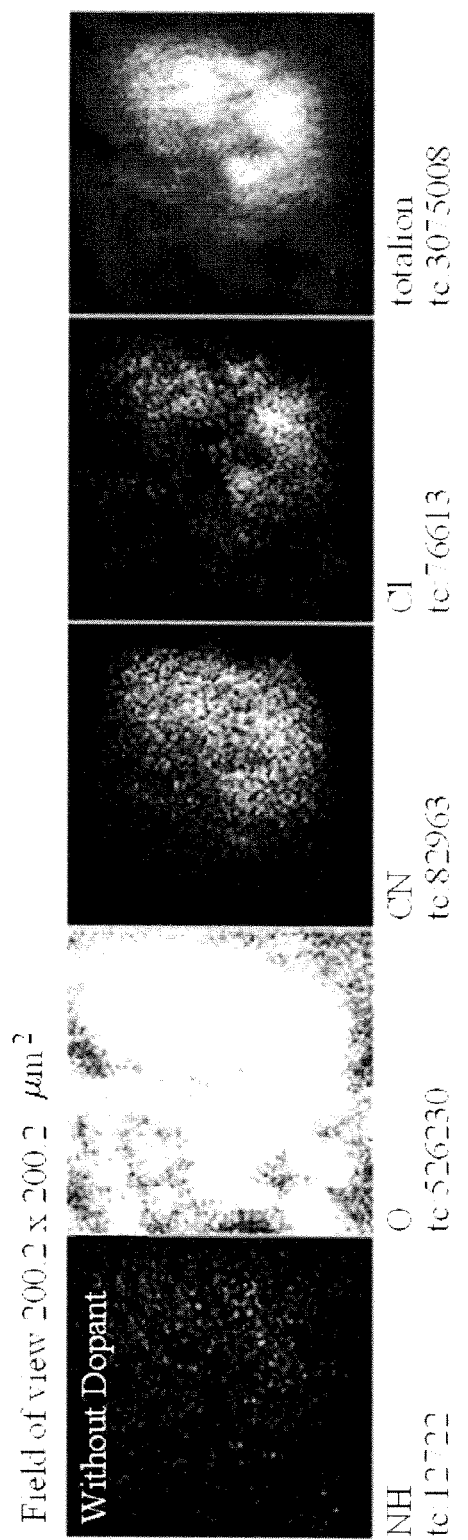
FIG. 8 is an electron micrograph for the surfaces of phosphors which do not include a doping element.

FIG. 7 discloses an electron micrograph for the surfaces of phosphors which include various kinds of doping elements, and FIG. 8 discloses an electron micrograph for the surfaces of phosphors which do not include a doping element.

Figure 9:
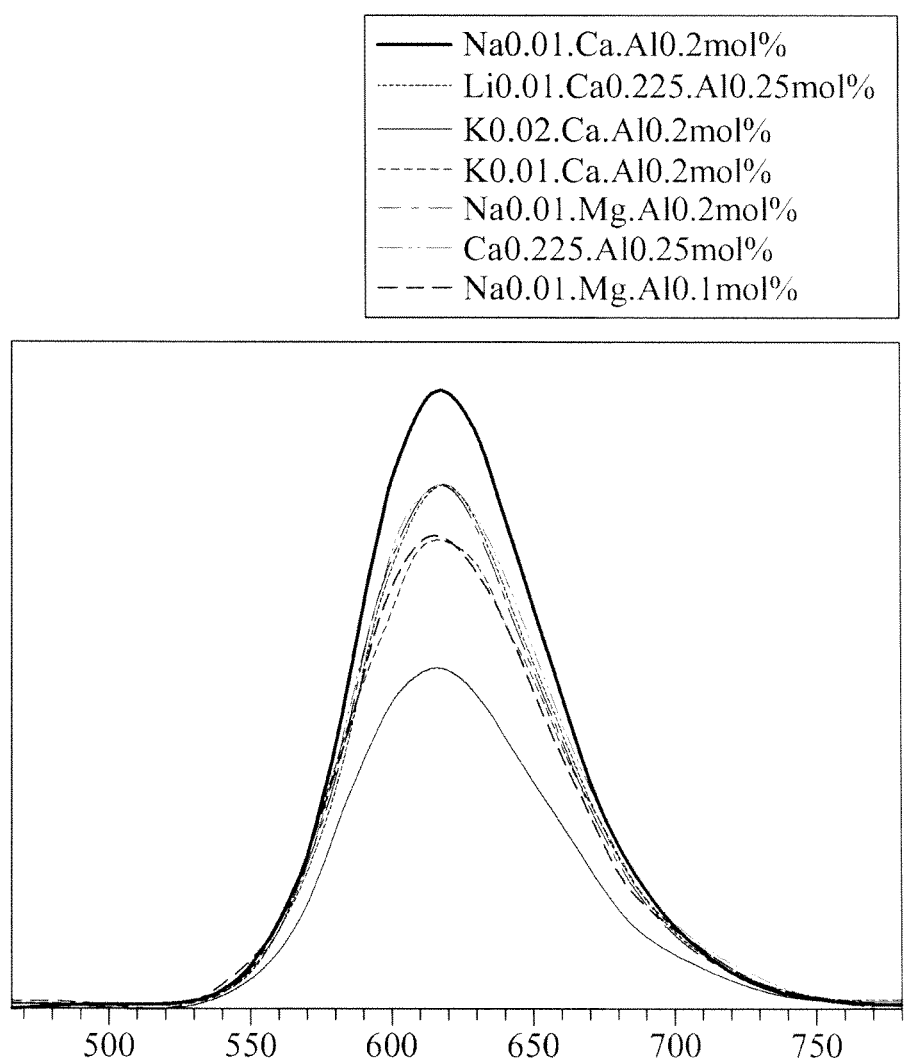
FIG. 9 is a graph showing luminance characteristics of a phosphor including lithium, potassium, and magnesium as doping elements.

FIG. 9 discloses a graph showing luminance characteristics of a phosphor including lithium, potassium, and magnesium as doping elements. Referring to FIG. 9, it can be known that the phosphors each including lithium and potassium show 50% or less luminance than the phosphor in Example 1 according to the present application and the phosphor including magnesium shows 60% or less luminance than the phosphor in Example 1 according to the present application.

Figure 10:
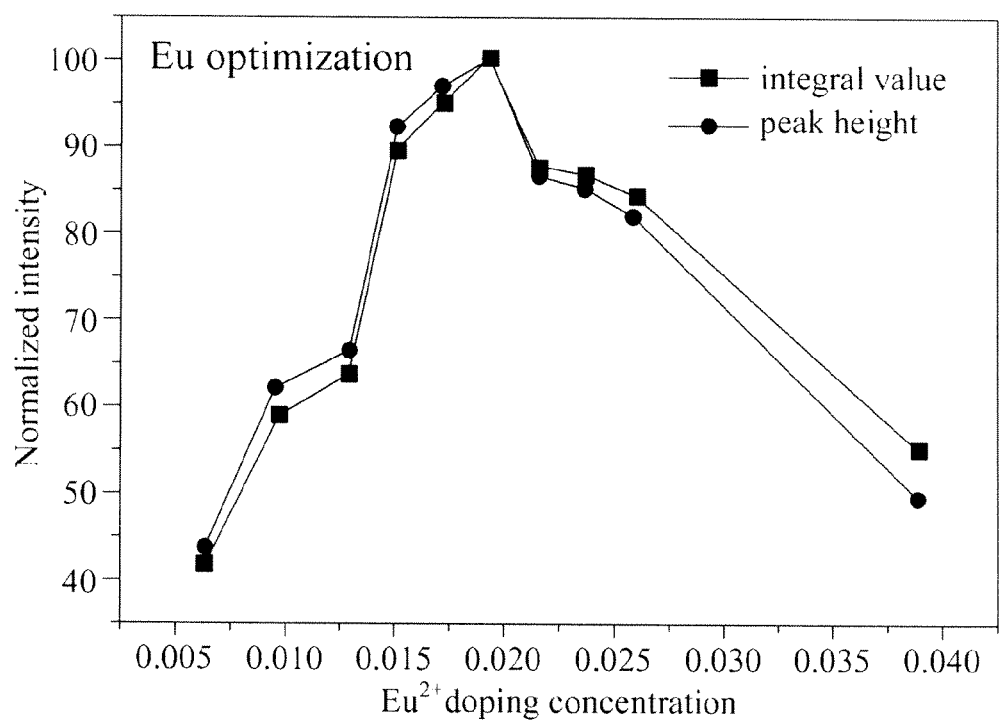
FIG. 10 is a graph showing the luminous efficiency of the phosphor according to the concentration of an europium (Eu) element.

FIG. 10 illustrates a graph showing the luminous efficiency of the phosphor according to the concentration of an europium (Eu) element.

Hereinafter, examples according to the present application will be described in detail. However, the present application is not limited to the examples.

Figure 12:
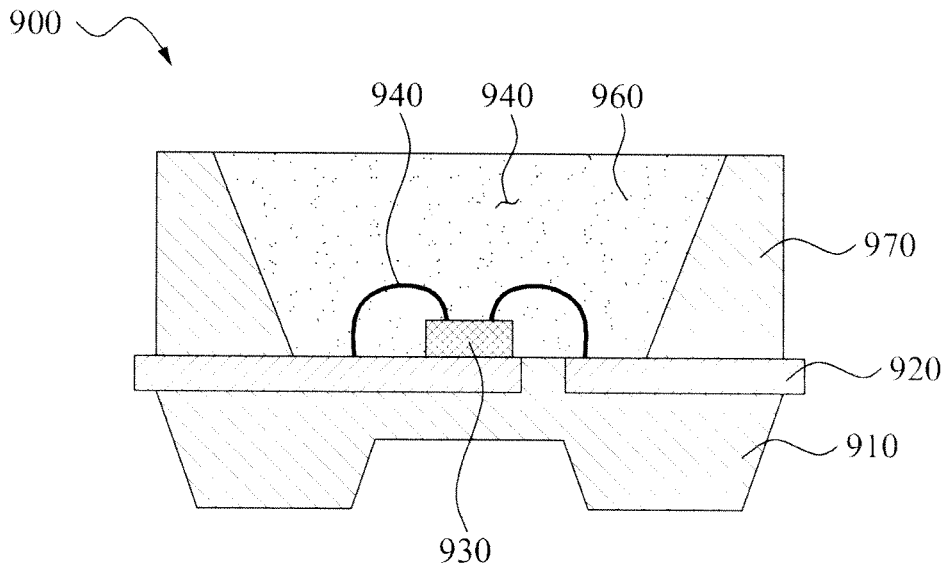
FIG. 12 is a side cross-sectional view illustrating a light-emitting element package according to a first example of the present application.

FIG. 12 is a side cross-sectional view illustrating a light-emitting element package of a first example. As illustrated in FIG. 12, a light-emitting element package 900 includes a package body 910, lead frames 920 molded to the package body 910 and separated from each other, a light-emitting element 930 mounted on at least one lead frame, a bonding wire 940 electrically connecting the light-emitting element 930 and the lead frame 920, and a resin packaging unit 950 encapsulating the light-emitting element 930. Moreover, in a light-emitting element package 900, a reflection cup 970 in which a groove portion is formed so as to surround the light-emitting element 900 may be formed on an upper portion of the package body 910 based on the position of the lead frame.

At this time, the reflection cup 970 is formed in an annular shape on the package body, a mounting region of the light-emitting element 900 is defined by the groove portion of the reflection cup 970, and at least one lead frame is exposed to the bottom of the groove portion to provide the mounting region. Further, the side wall of the reflection cup may be formed as a sloped reflection surface in order to reflect light emitted from the light-emitting element 900 in a desired direction. Here, the package body 910 may also be formed integrally with the reflection cup 970.

Moreover, the light-emitting element 930 may be bonded on the lead frame 920 by an adhesive and the like, and generates light with a predetermined wavelength by receiving current from an external power source through the bonding wire 940. The light-emitting element 930 may emit light with a wavelength ranging from 200 nm to 500 nm, and may be, for example, a blue LED or ultraviolet LED having a semiconductor stacked structure emitting blue light or ultraviolet rays. Various examples of the semiconductor stacked structure of the light-emitting element will be described with reference to FIGS. 13 to 18.

In addition, the resin packaging unit 950 is filled at an inner side of the reflection cup so as to cover the light-emitting element 930, the bonding wire 940, and the lead frame 920. Furthermore, the resin packaging unit 950 may also include a phosphor 960 converting an emission wavelength of the light-emitting element into light at a different wavelength.

The phosphor 960 may be used by mixing a red phosphor with at least one of green, blue, and yellow phosphors in order to emit white light. That is, the resin packaging unit 950 is used by properly mixing a phosphor mixture with a curable transparent resin such as an epoxy resin, a silicone resin, or a silicone/epoxy mixture resin.

Here, as the red phosphor for outputting white light, it is possible to use a nitride-based phosphor including a compound synthesized in Examples 1 to 3 of the present application and expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element. The nitride-based red phosphor has better reliability against external environmental factors such as heat, moisture, and the like and less possibility of discoloration than the sulfide-based phosphor. In particular, the nitride-based red phosphor has a high phosphor excitation efficiency at a dominant wavelength of a blue LED chip limited to a particular range (430 nm to 465 nm) in order to obtain a high color reproducibility.

Moreover, as a blue phosphor, $(Ba, Sr, Ca)_5(PO_4)_3Cl$:$(Eu^{2+}, Mn^{2+})$ or $Y_2O_3$:$(Bi^{3+}, Eu^{2+})$ may be selectively used. A green phosphor may include any one of a silicate-based phosphor, a sulfide-based phosphor, and a nitride-based phosphor. The silicate-based green phosphor may include any one of an $A_2SiO_4$ silicate-based green phosphor having a 2,1,4 composition or an $A_3SiO_5$ silicate-based green phosphor having a 3,1,5 composition, or a sulfide-based green phosphor having a composition of $SrGa_2S_4$:Eu or a nitride-based green phosphor having a composition of Beta-SiAlON. Here, A may be Sr, Ba, Ca, or Mg, Sr is an essential component, and Ba, Ca, and Mg may be selectively included if necessary (0=Ba,Ca, Mg=1).

A nitride-based green phosphor may include crystals of nitride or oxynitride in which Eu is solid-solubilized among crystals having a β-type $Si_3N_4$ crystal structure, and may include a phosphor expressed as $Si_{6-z}Al_zO_zN_{8-z}$:$Eu_y$, $Sr_x$ (0.009<x<0.011, 0.018<y<0.025, 0.23<z<0.35), or $Si_{6-z}Al_zO_zN_{8-z}$ (0.24=y=0.42, the content of Eu is 0.05 at % to 0.25 at %). Moreover, a yellow phosphor may include any one of a garnet-based phosphor of YAG or TAG-series, an $A_2SiO_4$ silicate-based phosphor having a 2,1,4 composition or an $A_3SiO_5$ silicate-based phosphor having a 3,1,5 composition, or a nitride-based phosphor having an alpha-SiAlON composition (here, A may be Sr, Ba, Ca, or Mg, Sr is an essential component, and Ba, Ca, and Mg may be selectively included if necessary (0=Ba, Ca, Mg=1)).

As the nitride-based phosphor, it is possible to use a Ca-α-sialon phosphor expressed as $CaXSi_{12-(m+2)}Al_{(m+n)}O_nN_{16-n}$: $Eu_y$ (0.01<y<0.7, 0.6<m<3.0 and 0=n<1.5).

Hereinafter, various examples of the light-emitting element according to the present application will be described with reference to FIGS. 13 to 18.

Figure 13:
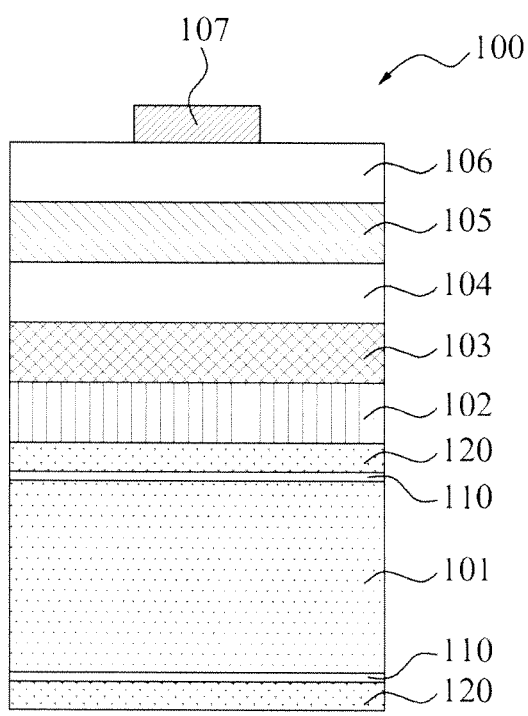
FIGS. 13 to 31 are side cross-sectional views illustrating a light-emitting element according to first and second example of the present application.

First, as illustrated in FIG. 13, a light-emitting element 100 according to a first exemplary embodiment may have a semiconductor-stacked structure. A substrate 101 made of an Si—Al alloy (hereinafter referred to as an 'Si—Al alloy substrate'), protection layers 120 formed on upper and lower surfaces of the Si—Al alloy substrate 101, a bonding metal layer 102 on the protection layer 120, a reflective metal layer 103, a p-type semiconductor layer 104, an active layer 105, and an n-type semiconductor layer 106 are sequentially stacked. The p-type and n-type semiconductor layers 104 and 106 and the active layer 105 may be made of a GaN-based semiconductor material, that is. $Al_xGa_yIn_{(1-x-y)}N$ (0=x=1, 0=y=1, 0=x+y=1) semiconductor material, and the like, and form a light-emitting structure.

An n-side electrode 107 is formed on the n-type semiconductor layer 106. The reflective metal layer 103 interposed between the bonding metal layer 102 and the p-type semiconductor layer 104 reflects light which is incident from the semiconductor layer upwardly, thereby further increasing the luminance of the light-emitting element. The reflective metal layer 103 may be made of metal with high reflectance, for example, metal selected from a group consisting of Au, Ag, Al, Rh, and an alloy of two or more thereof. However, the reflective metal layer 103 need not be formed, if necessary. The bonding metal layer 102 serves to bond the Si—Al alloy substrate 101 to the light-emitting structure, and Au and the like may be used. Here, the light-emitting element 100 of the present application includes the bonding metal layer 102, but the Si—Al alloy substrate 101 may also be directly bonded to the p-type semiconductor layer 104 without the bonding metal layer 102. Accordingly, the light-emitting element 100 of the present application uses the Si—Al alloy substrate 101 as a conductive substrate.

The Si—Al alloy is advantageous in terms of thermal expansion coefficient, heat conductivity, mechanical processability, and price. That is, the thermal expansion coefficient of the Si—Al alloy substrate 101 is similar to that of a sapphire substrate. Accordingly, in the case of preparing the light-emitting element 100 by using the Si—Al alloy substrate 101, it is possible to obtain the light-emitting element 100 with less defects and high quality by significantly reducing a substrate warpage phenomenon and a cracking phenomenon in the light-emitting structure that occur when a process of bonding a conductive substrate made of Si and a process of separating a sapphire substrate by laser irradiation in the related art are performed.

Further, heat conductivity of the Si—Al alloy substrate 101 is about 120 W/m·K to about 180 W/m·K, and thus the Si—Al alloy substrate 101 has excellent heat emission characteristics. In addition, since the Si—Al alloy substrate 101 may be easily prepared by melting Si and Al at a high pressure, the Si—Al alloy substrate may be easily obtained at a low cost.

In particular, in the light-emitting element 100 of the present application, the protection layers 120 are additionally formed on the upper and lower surfaces of the Si—Al alloy substrate 101 in order to prevent chemical infiltration into the Si—Al alloy substrate 101 during a cleaning process. Here, the protection layers 120 may be made of metal, a conductive dielectric, and the like. At this time, when the protection layers 120 are made of metal, it may be made of any one of Ni, Au, Cu, W, Cr, Mo, Pt, Ru, Rh, Ti, and Ta, or an alloy of two or more thereof in the metal group. In this case, the protection layers 120 may be formed by an electroless plating method, a metal deposition, a sputtering method, a chemical vapor deposition (CVD), or the like, and at this time, a seed metal layer 110 serving as a seed during a process of plating the protection layer 120 may be further formed between the Si—Al alloy substrate 101 and the protection layer 120 made of metal. The seed metal layer 110 may be made of Ti/Au and the like. Furthermore, when the protection layer 120 is made of a conductive dielectric, the conductive dielectric may be made of indium tin oxide (ITO), indium zinc oxide (IZO), copper indium oxide (CIO), or the like.

In this case, the protection layer 120 may be formed by deposition, a sputtering method, or the like. The protection layer 120 is formed to have a thickness of preferably 0.01 μm to 20 μm, and more preferably 1 μm to 10 μm.

Hereinafter, a method for preparing the light-emitting element according to the first example of the present application will be described in detail with reference to FIGS. 14 to 21. FIGS. 14 to 21 are process sectional views sequentially illustrating the method for preparing the light-emitting element according to the first example of the present application.

Figure 14:
Figure 15:
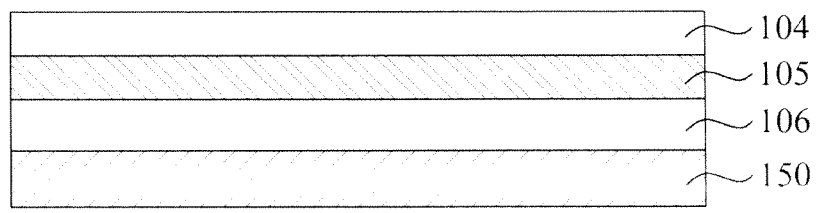

First, as illustrated in FIG. 14, a sapphire substrate 150 is prepared as a growth substrate, and then, as illustrated in FIG. 15, the n-type semiconductor layer 106, the active layer 105, and the p-type semiconductor layer 104 are sequentially formed on the sapphire substrate 150.

Figure 16:
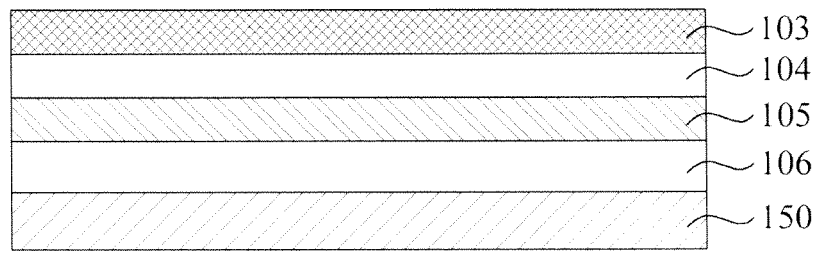
Figure 17:
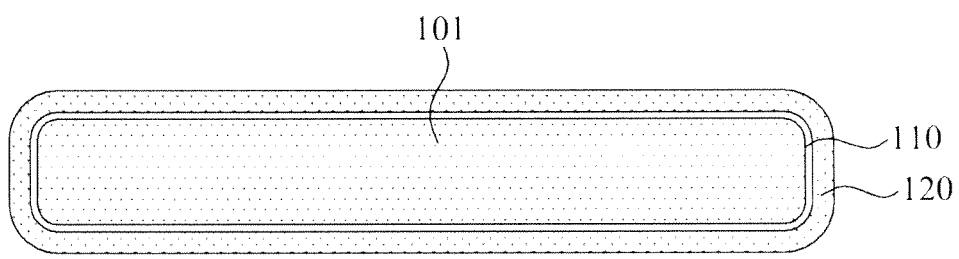

Next, as illustrated in FIG. 16, the reflective metal layer 103 is formed on the p-type semiconductor layer 104 by using a metal material with high reflectance, for example, Au, Al, Ag, Rh, or the like. Here, the reflective metal layer 103 need not be formed, if necessary. Thereafter, as illustrated in FIG. 17, the protection layer 120 is formed on the surface of the Si—Al alloy substrate 101. The protection layer 120 may be formed by using metal or a conductive dielectric.

Here, when the protection layer 120 is formed of metal, the protection layer 120 may be made of any one of Ni, Au, Cu, W, Cr, Mo, Pt, Ru, Rh, Ti, and Ta, or an alloy of two or more thereof in the metal group, and may be formed by electroless plating, a metal deposition, a sputtering method, a CVD method, or the like. At this time, when the protection layer 120 made of a metal material is formed by the electroless plating method, the seed metal layer 110 serving as a seed during a process of plating the protection layer 120 may be additionally formed before the protection layer 120 is formed on the surface of the Si—Al alloy substrate 101.

Further, when the protection layer 120 is formed of a conductive dielectric, the protection layer 120 may be made of ITO, IZO, ClO, or the like, and may be formed by deposition, the sputtering method or the like. The protection layer 120 is formed to have a thickness of preferably 0.01 μm to 20 μm over the overall surface of the Si—Al alloy substrate 101, and the protection layer 120 is formed to have a thickness of more preferably 1 μm to 10 μm. When the protection layer 120 is formed to have a thickness less than 0.01 μm it is difficult for the protection layer 120 to fully serve to prevent the infiltration of chemicals such as HCL, HF, KOH, and the like to be described below, and when the protection layer 120 is formed to have a thickness larger than 20 μm, the thermal expansion coefficient of the Si—Al alloy substrate 101 may change, and thus it is preferred that the protection layer 120 is formed to have the thickness of the aforementioned range.

At this time, although not illustrated in the drawings, the protection layer 120 is formed, and then the surface of the protection layer 120 may be subjected to a chemical mechanical polishing (CMP) process to improve surface roughness.

Figure 18:
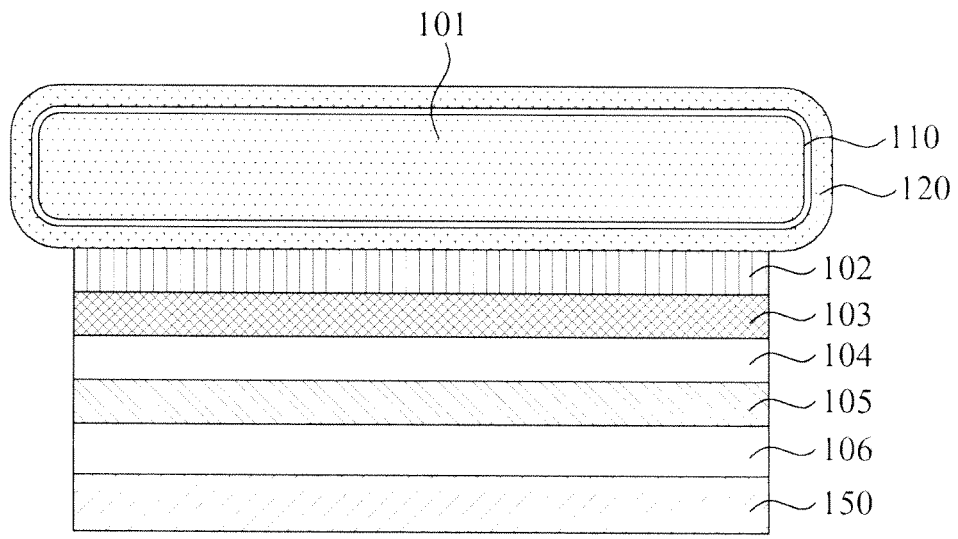

As described above, the Si—Al alloy substrate 101 with the protection layer 120 formed on the surface thereof is prepared, and then the Si—Al alloy substrate 101 with the protection layer 120 formed on the surface thereof is bonded onto the reflective metal layer 103 by using the bonding metal layer 102, as illustrated in FIG. 18. Here, as described above, the Si—Al alloy substrate 101 may be bonded by using the bonding metal layer 102, but the Si—Al alloy substrate 101 with the protection layer 120 formed on the surface thereof may be directly bonded onto the reflective metal layer 103 without using the bonding metal layer 102.

Figure 19:
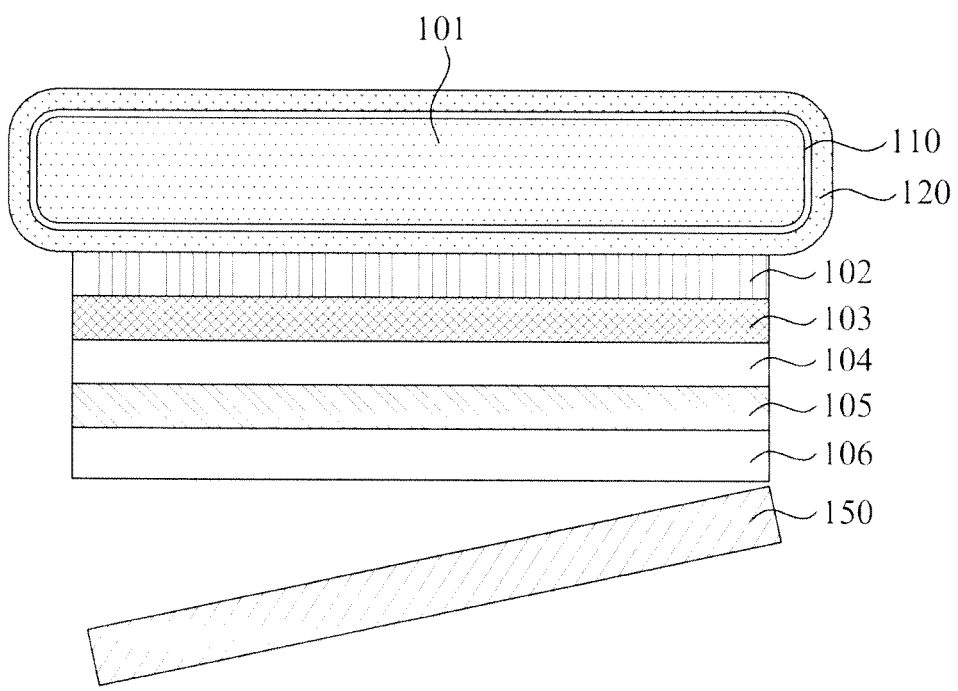

Subsequently, as illustrated in FIG. 19, the sapphire substrate 150 is separated from the n-type semiconductor layer 106 by a laser lift off (LLO) process. After the sapphire substrate 150 is separated, a cleaning processing using a chemical such as HCL, HF, KOH, and the like may be performed.

Figure 20:
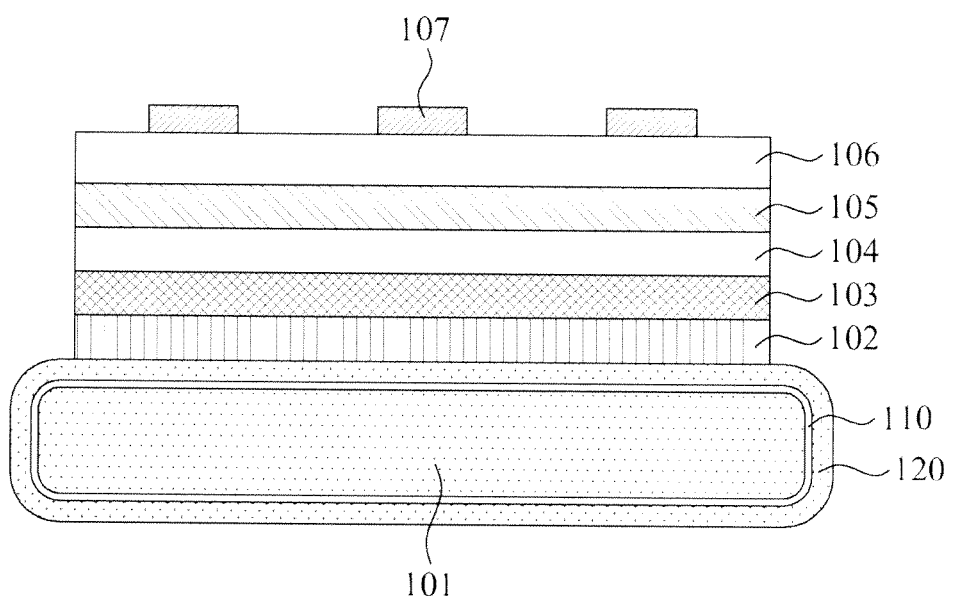

Thereafter, as illustrated in FIG. 20, a plurality of n-side electrodes 107 are formed on the n-type semiconductor layer 106 exposed by separation of the sapphire substrate 150. Here, before the n-side electrodes 107 are formed, a texturing process using KOH or the like may be performed on the surface of the n-type semiconductor layer 106 in order to improve the light extraction efficiency of the element.

Figure 21:
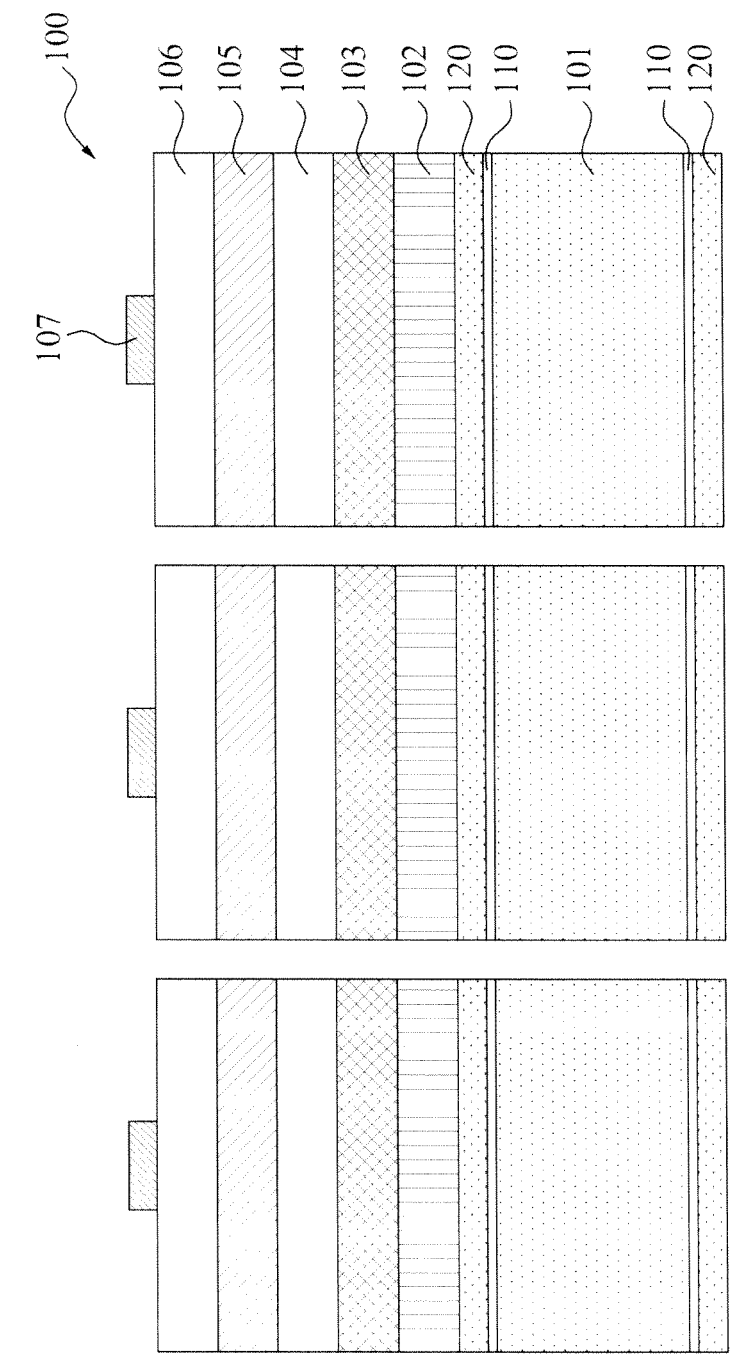

Subsequently, as illustrated in FIG. 21, the n-type semiconductor layer 106, the active layer 105, the p-type semiconductor layer 104, the reflective metal layer 103, the bonding metal layer 102, the protection layer 120, the seed metal layer 110 and the Si—Al alloy substrate 101 between the n-side electrodes 107 are diced to be separated as a chip unit. Whereby, the light-emitting element 100 according to the first example is obtained.

As described above, in the light-emitting element according to the first example of the present application, since the protection layer 120 such as Ni is additionally formed on the surface of the Si—Al alloy substrate 101, there is an effect that the Al metal of the Si—Al alloy substrate 101 may be prevented from being etched by a chemical such as HCL, HF, KOH, and the like, which are used in the cleaning process performed after the sapphire substrate 150 is separated, or by KOH or the like, which is used in the surface texturing process performed on the n-type semiconductor layer 106. Accordingly, in the light-emitting element according to the first example of the present application, there is an effect that a defect of peeling-off of the light-emitting structure bonded onto the Si—Al alloy substrate 101 may be prevented from occurring by preventing the Si—Al alloy substrate 101 from having protrusions and depressions thereon.

In addition, when a metal such as Ni or the like is used as a material of the protection layer 120, there is an advantage in that the surface roughness of the Si—Al alloy substrate 101 is improved, and thus the bonding between the Si—Al alloy substrate 101 and the light-emitting structure may be securely made. That is, in the related art, the Si—Al alloy substrate 101 is subjected to a cleaning process using a chemical material such as an acid or the like in order to remove a native oxide layer before the bonding metal layer 102 is formed, thereby forming surface protrusions and depressions ranging from 200 nm to 500 nm in height on average, while the Al metal on the surface of the Si—Al alloy substrate 101 is being etched. But as in the first example of the present application, when a metal such as Ni or the like is formed as the protection layer 120 on the surface of the Si—Al alloy substrate 101, and then the Ni CMP process is performed thereon, the surface irregularity may be reduced to 5 nm or less, and thus surface roughness may be improved similar to a mirror face.

As described above, the surface roughness of the Si—Al alloy substrate 101 is improved, and thus there is an effect that bonding between the Si—Al alloy substrate and the light-emitting structure may be securely made, and the bonding yield may be enhanced.

Figure 22:
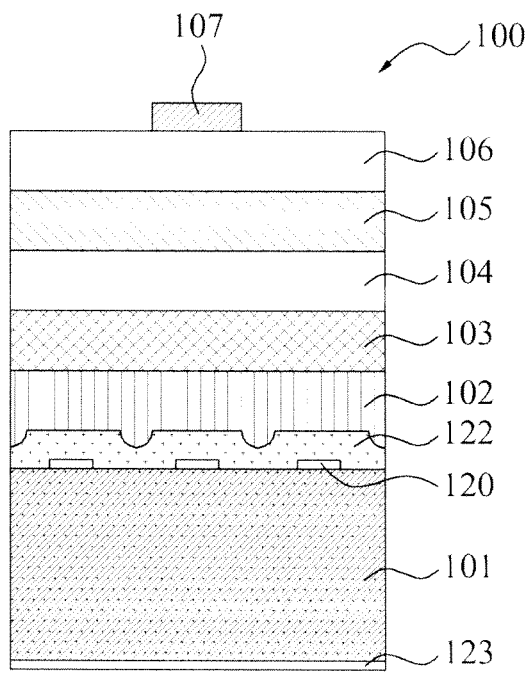

Next, as a light-emitting element according to a second example, as illustrated in FIG. 22, the light-emitting element 100 according to the first example of the present application has substantially the same configuration as that of the light-emitting element according to the first example of the present application, but is different from the light-emitting element according to the first example of the present application only in that the protection layer 120 is formed on the upper surface of the Si—Al alloy substrate 101 such that the protection layer 101 exposes a portion of the Si—Al alloy substrate 101, rather than being formed entirely on the upper and lower surfaces of the Si—Al alloy substrate 101, a conductive layer 122 is further formed on the protection layer 120 and on the upper surface of the Si—Al alloy substrate 101 exposed by the protection layer 120, and a contact metal layer 123 is formed on the lower surface of the Si—Al alloy substrate 101. In particular, it is preferred that the protection layer 120 is made of an insulating material, rather than a metal or a conductive dielectric. That is, in the light-emitting element according to the second example of the present application, while the protection layer 120 is made of an insulating material rather than a metal or a conductive dielectric, the protection layer 120 is formed to expose a part of the upper surface of the Si—Al alloy substrate 101 and the conductive layer 122 is additionally formed on the upper surface of the Si—Al alloy substrate 101 including the protection layer 120 in order to allow the Si—Al alloy substrate 101, on which the protection layer 120 is formed, and the light-emitting structure on the upper portion of the protection layer 120 to be electrically connected. Here, the conductive layer 122 may be made of metal and the like.

Hereinafter, a method for preparing a compound semiconductor light-emitting element according to the second example of the present application will be described in detail. However, a description of configurations in the second example, which are the same as those of the first exemplary embodiment will be omitted, and only different configurations in the second example will be described in detail.

First, as previously illustrated in FIGS. 14 to 16, the n-type semiconductor layer 106, the active layer 105, the p-type semiconductor layer 104, and the reflective metal layer 103 are sequentially formed on the sapphire substrate 150. Here, the reflective metal layer 103 need not be formed, if necessary.

Figure 23:
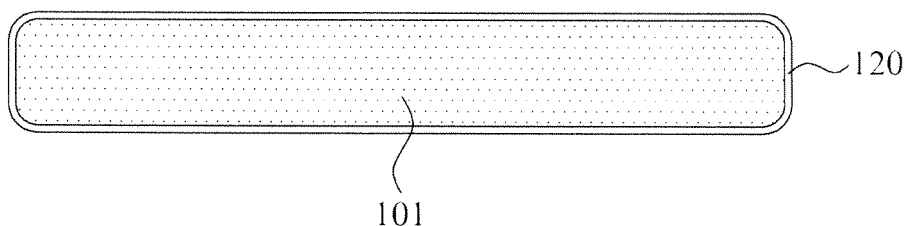

Thereafter, as illustrated in FIG. 23, the protection layer 120 is formed on the overall surface of the Si—Al alloy substrate 101. Here, the protection layer 120 may be made of an insulating material.

The protection layer 120 made of an insulating material may be formed to have a thickness ranging from 0.01 μm to 1 μm by CVD, a coating method or the like. At this time, although not illustrated in the drawings, after the protection layer 120 is formed, the surface of the protection layer 120 may be subjected to CMP.

Figure 24:
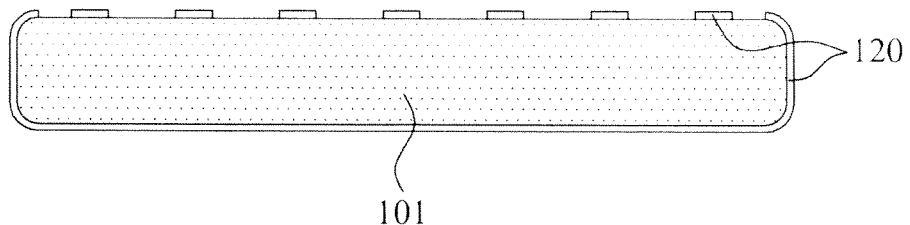
Figure 25:
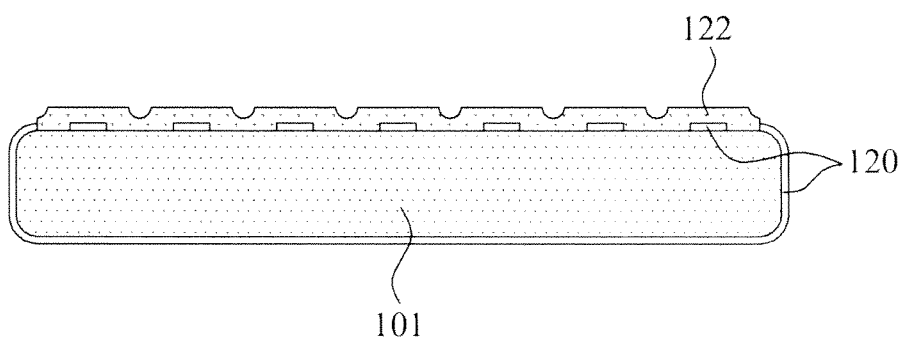
Figure 26:
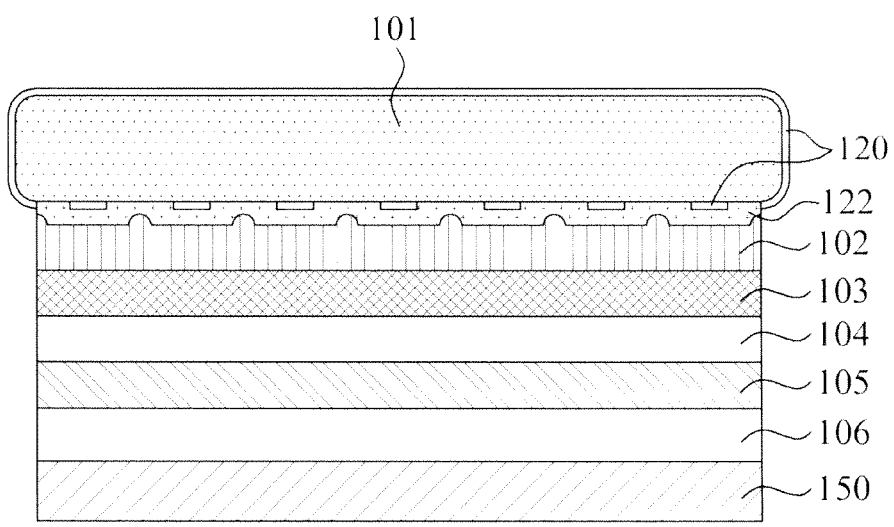

As illustrated in FIG. 24, a portion of the protection layer 120 is removed by an etching method or the like to expose a portion of the upper surface of the Si—Al alloy substrate 101. Thereafter, as illustrated in FIG. 25, the conductive layer 122 is formed on the upper surface of the Si—Al alloy substrate 101 including the protection layer 120. Subsequently, as illustrated in FIG. 26, the conductive layer 122 formed on the upper surface of the Si—Al alloy substrate 101 is bonded onto the reflective metal layer 103 by using the bonding metal layer 102.

Figure 27:
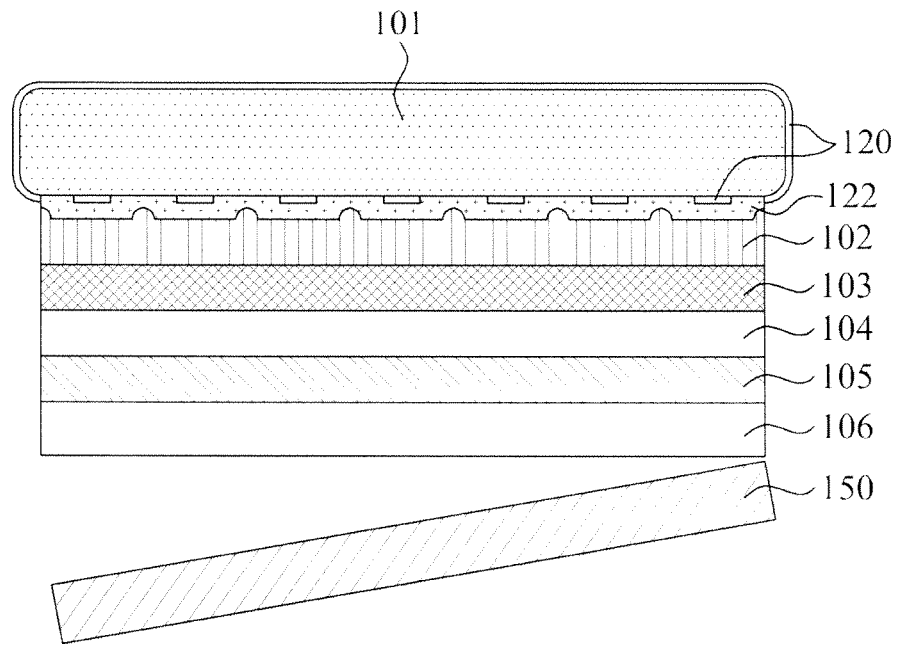

Thereafter, as illustrated in FIG. 27, the sapphire substrate 150 is separated from the n-type semiconductor layer 106 by a laser lift off process. Here, after the sapphire substrate 150 is separated, a cleaning processing using a chemical such as HCL, HF, KOH, and the like may be performed. At this time, in the light-emitting element according to the second example of the present application, since the protection layer 120 and the conductive layer 122 are formed on the surface of the Si—Al alloy substrate 101, Al metal of the Si—Al alloy substrate 101 may be prevented from being etched by the chemical used in the cleaning process.

Figure 28:
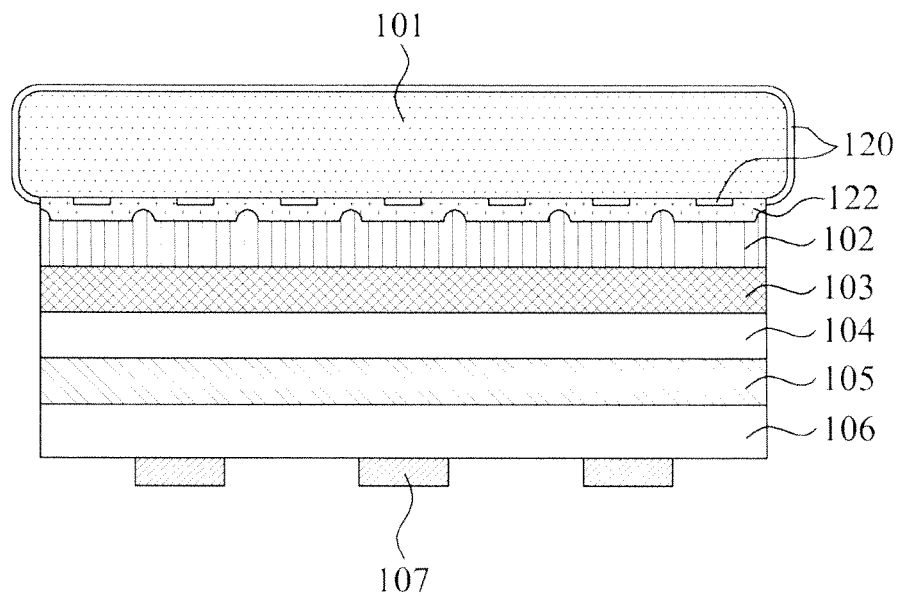

Thereafter, as illustrated in FIG. 28, a plurality of n-side electrodes 107 are formed on the n-type semiconductor layer 106 exposed by separation of the sapphire substrate 150. Here, before the n-side electrodes 107 is formed, a texturing process using KOH or the like may be performed on the surface of the n-type semiconductor layer 106 in order to improve the light extraction efficiency of the element. At this time, according to the present example, since the protection layer 120 and the conductive layer 122 are formed on the surface of the Si—Al alloy substrate 101. Al metal of the Si—Al alloy substrate 101 may be prevented from being etched by the chemical used in the texturing process.

Figure 29:
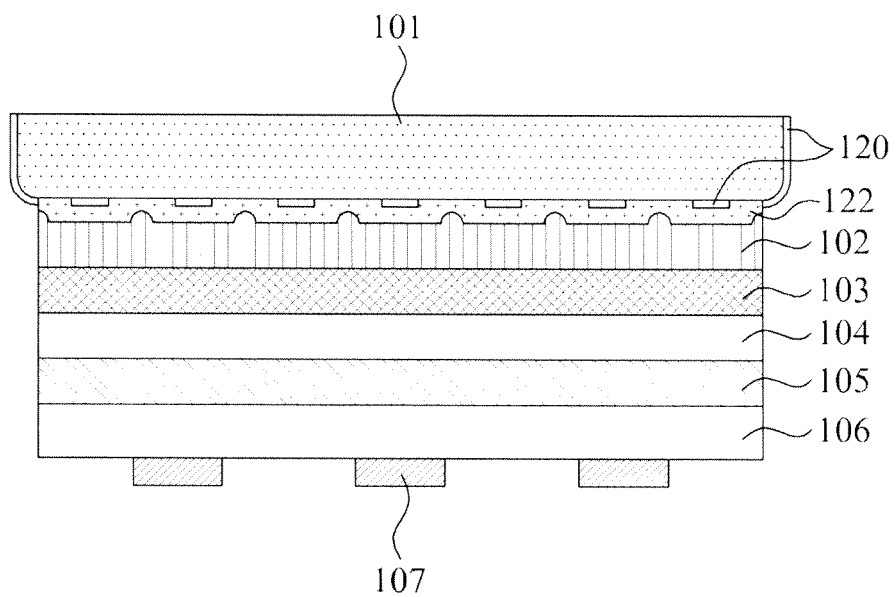
Figure 30:
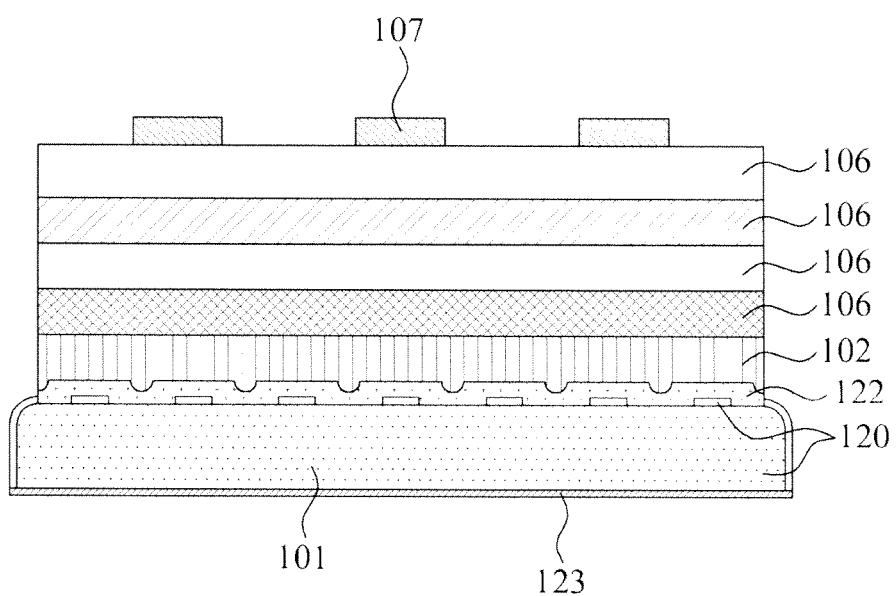

Thereafter, as illustrated in FIG. 29, a lapping process is performed to remove the lower surface of the Si—Al alloy substrate 101 including the protection layer 120 by a certain thickness. And then, as illustrated in FIG. 30, the contact metal layer 123 is formed on the lower surface of the Si—Al alloy substrate 101 exposed by the lapping process.

Figure 31:
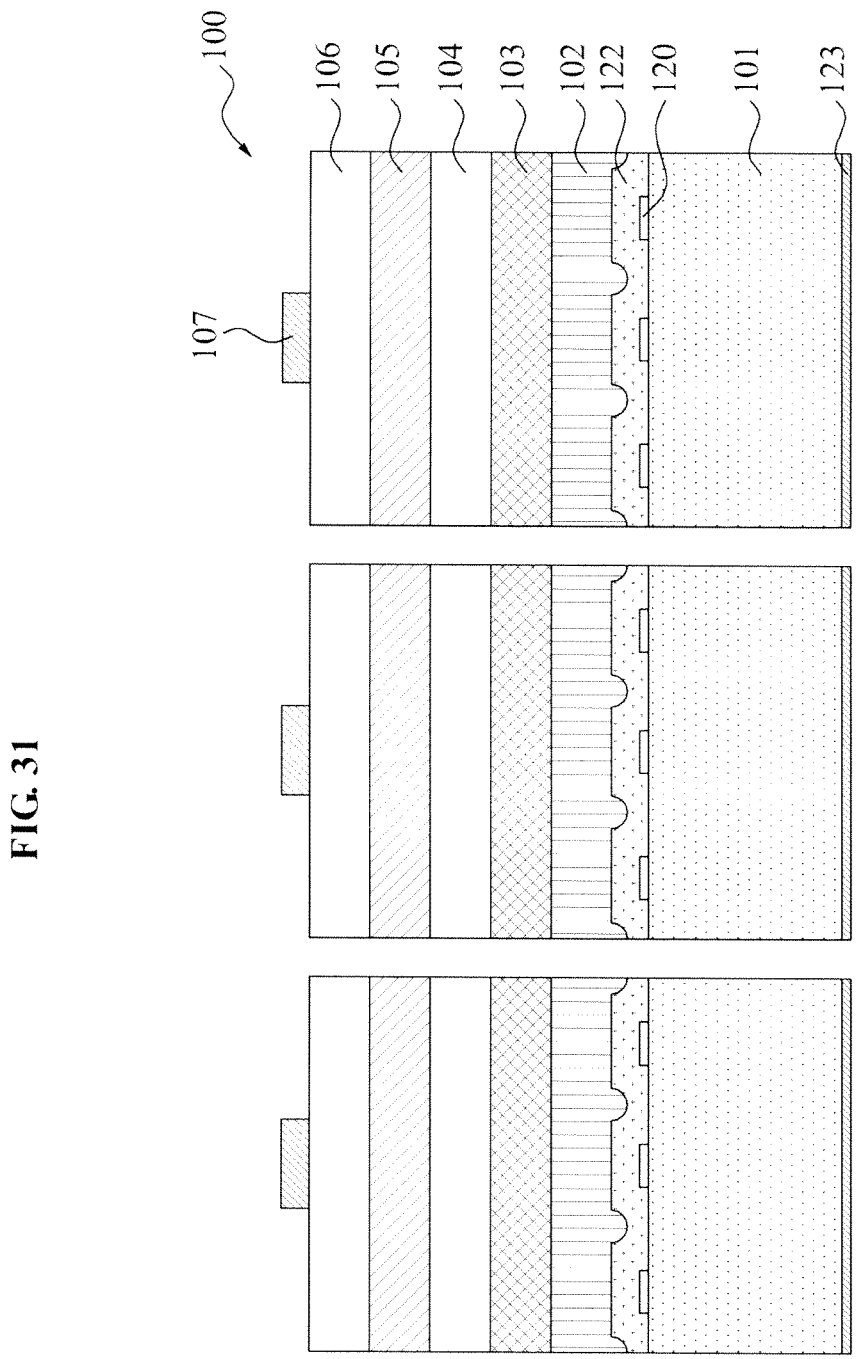

Subsequently, as illustrated in FIG. 31, the n-type semiconductor layer 106, the active layer 105, the p-type semiconductor layer 104, the reflective metal layer 103, the bonding metal layer 102, the conductive layer 122, the protection layer 120, the Si—Al alloy substrate 101, and the contact metal layer 123 between the n-side electrodes 107 are diced to be separated as a chip unit. Whereby, the light-emitting element 100 according to the second example is obtained.

Meanwhile, unlike the light-emitting element having the vertical structure according to the first and second examples, the present application may be a light-emitting element with a vertical and horizontal structure available for a high current operation by altering the disposition structure of the electrode.

Figure 32:
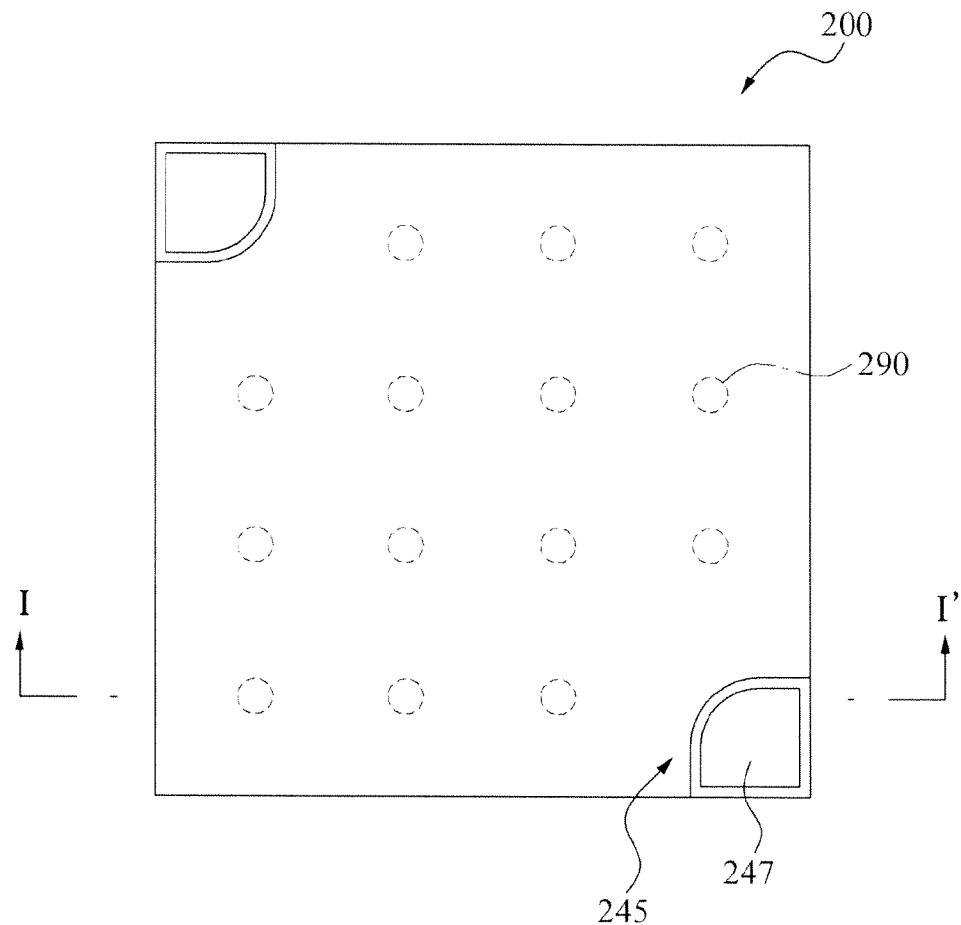
FIGS. 32 and 33 are a plan view and a cross-sectional view illustrating a light-emitting element with a vertical and horizontal structure according to a third example of the present application.
Figure 33:
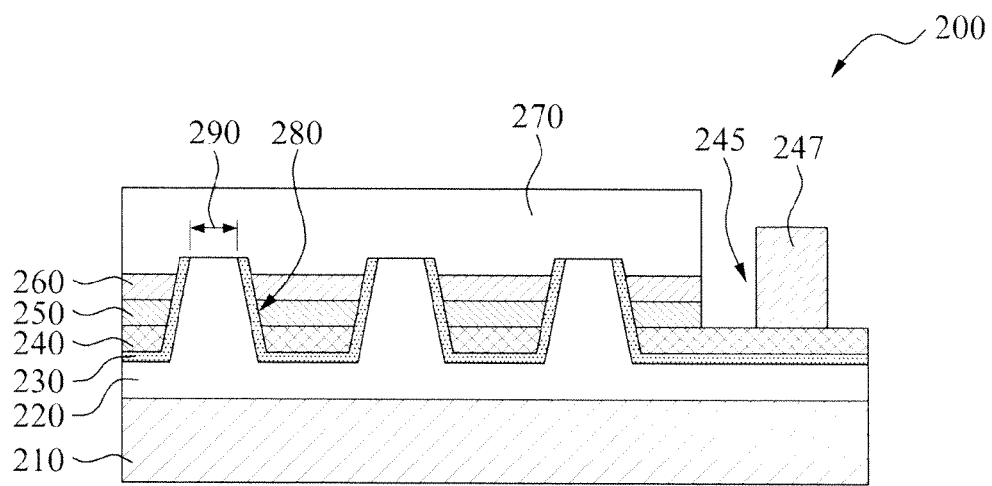

FIGS. 32 and 33 are a plan view and a cross-sectional view illustrating a light-emitting element with a vertical and horizontal structure as a third example. At this time, FIG. 33 is a cross-sectional view cut off along the line 1-1' of FIG. 32.

When described by referring to FIGS. 32 and 33, a light-emitting element 200 according to the third example includes a conductive substrate 210, a first electrode layer 220, an insulating layer 230, a second electrode layer 240, a second semiconductor layer 250, an active layer 260, and a first semiconductor layer 270, and the respective layers are sequentially stacked.

The conductive substrate 210 may be made of a material allowing electricity to flow thereacross. For example, it is preferred that the conductive substrate 210 is a metal substrate including any one of Au, Ni, Cu, and W, or a semiconductor substrate including any one of Si, Ge, and GaAs. The first electrode layer 220 is stacked on the conductive substrate 210, and the first electrode layer 220 is electrically connected with the conductive substrate 210 and the active layer 260, and thus it is preferred that the first electrode layer 220 be made of a material that may minimize contact resistance with the conductive substrate 210 and the active layer 260.

The first electrode layer 220 is stacked on the conductive substrate 210, and as illustrated in FIG. 33, a partial region thereof penetrates the insulating layer 230, the second electrode layer 240, the second semiconductor layer 250, and the active layer 260, and is further extended through a contact hole 280 penetrating into a certain region of the first semiconductor layer 270 to contact the first semiconductor layer 270, thereby electronically connecting the first semiconductor layer 270 with the conductive substrate 210. That is, the first electrode layer 220 electrically connects the conductive substrate 210 with the first semiconductor layer 270 through the contact hole 280, so that the conductive substrate 210 is electrically connected with the first semiconductor layer 270 through the size of the contact hole 280, more specifically, through a contact region 290 which is an area where the first electrode layer 220 and the first semiconductor layer 270 are in contact with each other through the contact hole 280.

Meanwhile, the insulating layer 230 is provided on the first electrode layer 220 in order to allow the first electrode layer 220 to be electrically insulated from layers other than the conductive substrate 210 and the first semiconductor layer 270. That is, the insulating layer 230 is provided between the side surfaces of the second electrode layer 240, the second semiconductor layer 250, and the active layer 260 exposed by the contact hole 280 and the first electrode layer 220, as well as between the first electrode layer 220 and the second electrode layer 240. Furthermore, it is preferred that the insulating layer 230 is provided even at the side surfaces of certain regions of the first semiconductor layer 270 which the contact hole 280 penetrates, thereby achieving insulation.

The second electrode layer 240 is provided on the insulating layer 230. Of course, as described above, the second electrode layer 240 is not present on certain regions where the contact hole 280 penetrates. At this time, as illustrated in FIG. 33, the second electrode layer 240 includes at least one region where a portion of the interface where the second electrode layer 240 is in contact with the second semiconductor layer 250 is exposed, that is, at least one exposed region 245. An electrode pad unit 247 may be provided on the exposed region 245 in order to connect an external power source to the second electrode layer 240. Meanwhile, the second semiconductor layer 250, the active layer 260, and the first semiconductor layer 270, described further below, are not provided on the exposed region 245. Further, as illustrated in FIG. 32, it is preferred that the exposed region 245 is formed at the corner of the semiconductor light-emitting element 200 in order to maximize a light emission area of the semiconductor light-emitting element 200. Meanwhile, it is preferred that the second electrode layer 240 is formed by including any one of Ag, Al, and Pt, because it is preferred that the second electrode layer 240 is provided as a layer having a characteristic of minimizing the contact resistance of the second semiconductor layer 250 and a function capable of enhancing luminous efficiency by reflecting light generated from the active layer 260 to the outside because the second electrode layer 240 is electrically in contact with the second semiconductor layer 250.

The second semiconductor layer 250 is provided on the second electrode layer 240, the active layer 260 is provided on the second semiconductor layer 250, and the first semiconductor layer 270 is provided on the active layer 260. At this time, it is preferred that the first semiconductor layer 270 is an n-type nitride semiconductor layer, and the second semiconductor layer 250 is a p-type nitride semiconductor layer. Meanwhile, the active layer 260 may be formed by selecting a different material according to the materials of the first and second semiconductor layers 270 and 250. That is, since the active layer 260 converts energy resulting from recombination of electron/hole into light to emit the light, it is preferred that the active layer 260 is formed of a material having a smaller energy band gap than that of the first and second semiconductor layers 270 and 250.

Meanwhile, a light-emitting element according to a fourth example is a modification of the structure of the light-emitting element according to the third example, and the first electrode layer connected with the contact hole may be exposed to the outside.

Figure 34:
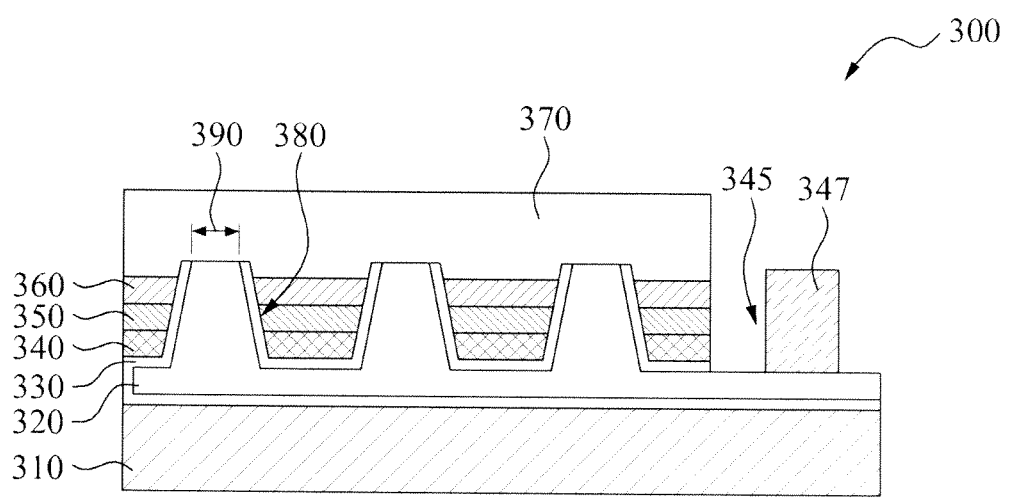
FIG. 34 is a cross-sectional view illustrating a light-emitting element with a vertical and horizontal structure according to a fourth example of the present application.

FIG. 34 is a cross-sectional view illustrating a light-emitting element according to the fourth example of the present application. In a light-emitting element 300 according to the fourth example, a second semiconductor layer 350, an active layer 360, and a first semiconductor layer 370 are formed on a conductive substrate 310. In this case, a second electrode layer 340 may be disposed between the second semiconductor layer 350 and the conductive substrate 310, and unlike the former examples, the second electrode layer 340 is not essentially needed. In the present example, a contact hole 380 having a contact region 390 in contact with the first semiconductor layer 370 is connected with a first electrode layer 320, and the first electrode layer 320 is exposed to the outside to have an electrical connection unit 345. An electrode pad unit 347 may be formed on the electrical connection unit 345. The first electrode layer 320 may be electrically separated from the active layer 360, the second semiconductor layer 350, the second electrode layer 340, and the conductive substrate 310 by an insulating layer 330. Unlike the contact hole connected with the conductive substrate in the previous third exemplary embodiment, in the fourth example of the present application, the contact hole 380 is electrically separated from the conducive substrate 310, and the first electrode layer 320 connected with the contact hole 380 is exposed to the outside. Accordingly, the conductive substrate 310 is electrically connected with the second semiconductor layer 340 to have a different polarity from that in the light-emitting element according to the previous third example.

Accordingly, in the light-emitting element with a vertical and horizontal structure, an emission area may be secured at the maximum level thereof by forming a portion of the first electrode on a light emission surface and disposing the other remaining portion thereof below the active layer, and even when a high operational current is applied to the electrode, the current may be uniformly distributed by uniformly disposing the electrode disposed on the light emission surface, thereby reducing a current concentration phenomenon in the high current operation.

Meanwhile, it is possible to form a wavelength conversion unit uniformly covering the outer surfaces of the light-emitting elements according to the first to fourth examples described above with a resin material, thereby providing chip-coated type light-emitting elements.

Figure 35:
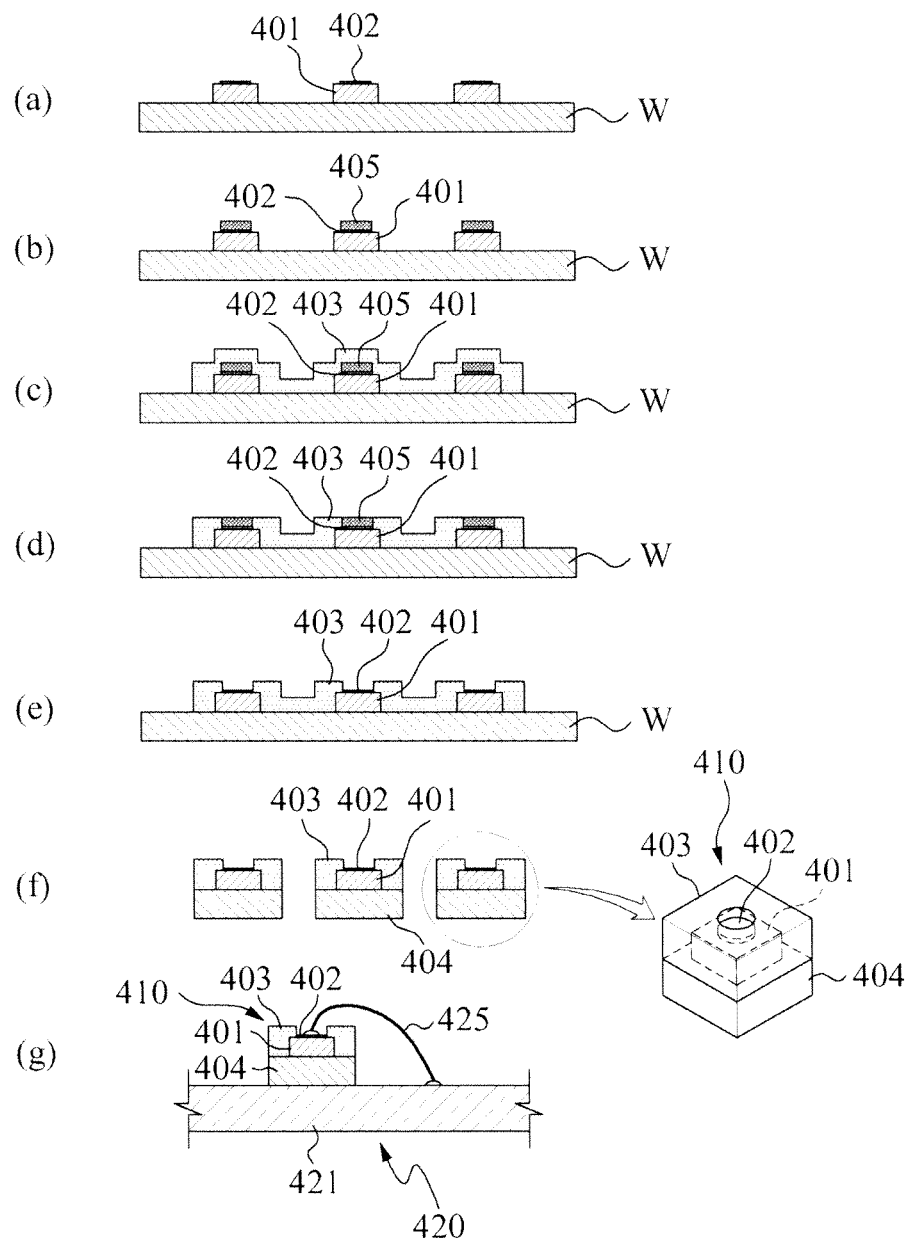
FIGS. 35 and 36 are cross-sectional views of each process for describing a method for preparing a light-emitting element according to fifth and sixth examples of the present application.
Figure 36:
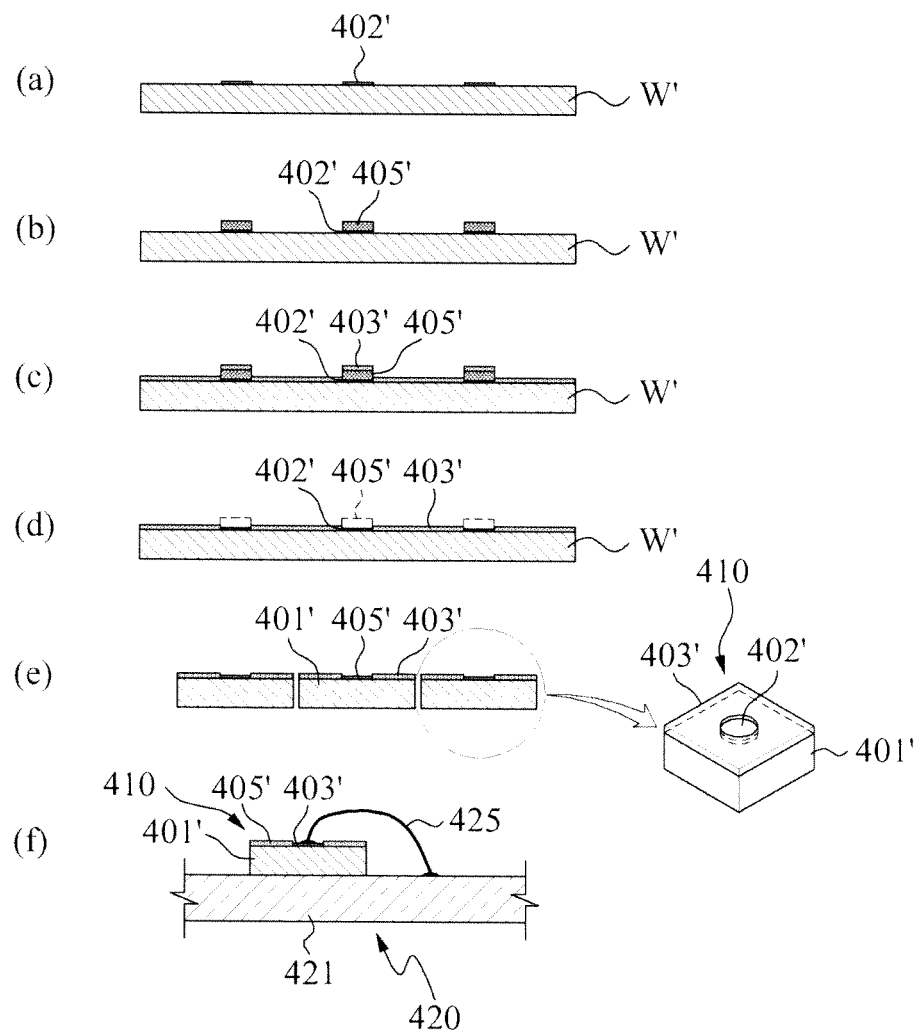

FIGS. 35 and 36 are cross-sectional views of each process for describing a method for preparing a light-emitting element according to fifth and sixth examples.

First, referring to FIG. 35, a bonding pad 402 electrically connected with a bonding wire 425 is provided on the upper surface of a light-emitting element 410, and one or two bonding pads 402 may be provided according to the structure of a chip die 401 provided as a horizontal or vertical type. That is, the number of bonding pads 402 to be formed varies depending on the structure of the chip die 401, and when the chip die 401 is provided to have a vertical structure or a vertical and horizontal structure in which P and N poles are respectively formed on upper and lower surfaces of the chip die 401, the bonding pad 402 is provided alone so as to be electrically connected with the P pole formed on the upper surface of the chip die 401.

In addition, when the chip die 401 is provided to have a horizontal structure or a vertical and horizontal structure in which both P and N poles are formed on the upper surface of the chip die 401, two bonding pads are provided so as to be respectively electrically connected with the P and N poles formed on the upper surface of the chip die 401. Furthermore, a wavelength conversion unit 403 is formed by mixing phosphors with a transparent resin material such as epoxy, silicone, resin, and the like, so as to constantly cover an external surface of the chip die 401 die-attached to a sub-mount 404. At this time, the wavelength conversion unit 403 is formed by a method of printing a phosphor-mixed transparent resin such as silicone, epoxy, and the like with a certain thickness, and the wavelength conversion unit 403 may be formed so as to cover the entire chip die 401 and is cured by heat or UV light, which is artificially provided.

Here, the wavelength conversion unit 403 includes a fluorescent material as a wavelength conversion means which is any one of YAG-series, TAG-series, and silicate-based materials capable of converting light generated from the chip die into white light, and in particular, the red phosphor may use a phosphor including a compound synthesized in Examples 1 to 3 of the present application and expressed in the composition formula: $A_z(Sr, M)_2(Si, Al)O_{4-x}N_y:R(0<x<3, y=2x/3, 0.001<z<0.1)$, where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element. Moreover, a lead frame 420 is electrically connected through the bonding wire 425 with at least one of the bonding pad 402 exposed to the outside through the upper surface of the wavelength conversion unit 403.

Next, referring to FIG. 36, in a light-emitting element according to the sixth example, a wavelength conversion unit 403 is formed only on an upper surface of a chip die 401'.

Accordingly, as illustrated in FIG. 35(g), a light-emitting element package according to the first example of the present application may include a lead frame 421 integrally provided at an inner portion of a package body (not illustrated), which is a resin structure injection-molded with a resin material, and the metal wire 425 having one end wire-bonded with the bonding pad 402 of the light-emitting element 410 according to the fifth exemplary embodiment and the other end wire-bonded with the lead frame 421. Further, as illustrated in FIG. 36(*f*), a light-emitting element package according to the third example of the present application is formed such that a light-emitting element 410' according to the sixth example is mounted on the upper surface of the lead frame 421 having a cathode lead and an anode lead, the lead frame 421 is integrally provided in the package body (not illustrated) injection-molded with a resin material to form a cavity which is open to an upper portion, and the light-emitting chip 410' which is exposed to the outside through the cavity of the package body is electrically connected with the lead frame 421 through the metal wire 425 having one end bonded to the bonding pad 402'.

As described above, when the light-emitting element with a vertical structure or a vertical and horizontal structure is used for a high output light-emitting element package, the phosphor layer is directly in contact with a light emission surface of the light-emitting element with the vertical structure or the vertical and horizontal structure, leading to degradation of the phosphor caused by heat generated from the light-emitting element.

However, the nitride-based red phosphor according to the present application is chemically stable and thus has better reliability against external environmental factors such as heat, moisture, and the like and less possibility of discoloration than the sulfide-based phosphor in the related art. Accordingly, the red phosphor according to the present application allows the wavelength conversion unit to be directly formed on the light emission surface of the light-emitting element, and a high output/high reliability white light-emitting element package also to be prepared.

Figure 37:
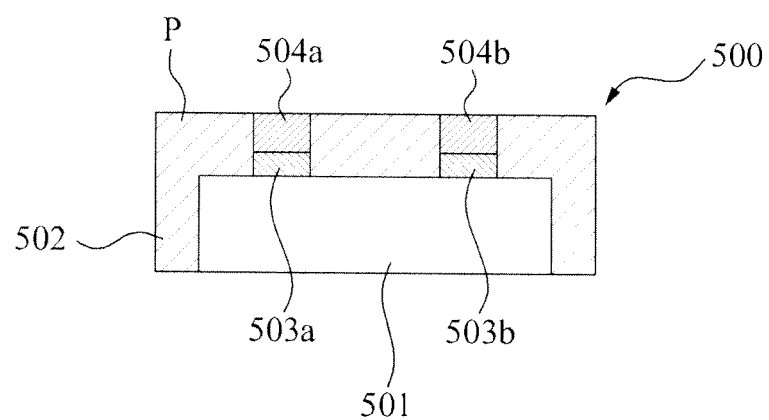
FIG. 37 is a cross-sectional view schematically illustrating a light-emitting element according to a seventh example of the present application.

FIG. 37 is a cross-sectional view schematically illustrating a light-emitting element according to a seventh example. Referring to FIG. 37, the light-emitting element 500 according to the seventh example includes an LED chip 501 and a wavelength conversion unit 502 formed to cover the surface thereof and converting the wavelength of light emitted from the LED chip 501. To this end, the wavelength conversion unit 502 may be adopted as a structure in which the phosphors (P) are distributed within a transparent resin unit. The light-emitting element 500 may emit white light as light converted by the wavelength conversion unit 502 and light emitted from the LED chip 501 are mixed. The LED chip 501 may have a structure in which an n-type semiconductor layer, a light emission layer, and a p-type semiconductor layer are stacked, and first and second electrodes 503*a* and 503*b* are formed on one surface thereof.

As illustrated in FIG. 37, when the surface of the LED chip 501 on which the first and second electrodes 503*a* and 503*b* are formed is defined as a first surface, the opposing surface of the first surface is defined as a second surface, and a surface positioned between the first and second surfaces is defined as a side surface, the wavelength conversion unit 502 may be formed so as to cover the first surface (the electrode-formed surface) and the side surface of the LED chip 501.

This is intended to allow light from the LED chip 501 to be emitted in an upward direction and in a lateral direction based on FIG. 37 In the present exemplary embodiment, the wavelength conversion unit 502 is provided in a shape to be thinly coated along the surface of the LED chip 501, and entirely uniform light may be obtained, as compared to a method in which a phosphor is injected into a cup of a package body.

Figure 38:
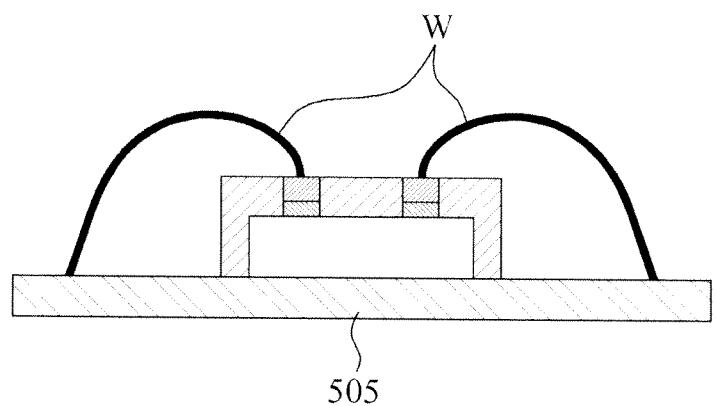
FIG. 38 is a schematic cross-sectional view illustrating a light-emitting element package in a fourth example using the light-emitting element of the seventh example in FIG. 37.

In addition, the size of the element may be reduced because the wavelength conversion unit 502 is directly applied to the surface of the LED chip 501 and a package body is not separately included. As a structure for electrical connection of the LED chip 501, in the present example, first and second electrical connection units 504*a* and 504*b* including a plated layer are used instead of a lead frame. Specifically, the first and second electrical connection units 504*a* and 504*b* are formed so as to be connected with the first and second electrodes 503*a* and 503*b*, and include a plated layer, respectively. The first and second electrical connection units 504*a* and 504*b* are exposed to the outside through the wavelength conversion unit 502 and provided as a region for wire bonding and the like. In this manner, the light-emitting element 500 has a simplified structure as compared to a typical package in the related art, and may be variously used for a light-emitting device such as a COB (Chip On Board), a package form, and the like FIG. 38 is a schematic cross-sectional view illustrating the light-emitting element package in a fourth example using the light-emitting element of the seventh example in FIG. 37. The light-emitting element package in the fourth example in FIG. 38 may be implemented by mounting the light-emitting element of the seventh example on a substrate 505. In this case, the reference numeral denoting the light-emitting element is omitted in FIG. 38.

As the substrate 505, a circuit board with a circuit pattern formed on an insulating base material may be used, and wires (W) are formed to connect the light-emitting element with the circuit pattern. As described above, the light-emitting element is mounted in a direction that the second surface of the LED chip faces the substrate 505 because light is emitted through the first surface and the side surface of the light-emitting element. Although methods other than a method of mounting the light-emitting element on the substrate 505 are not separately illustrated, the light-emitting element may be mounted on a lead frame so as to be used in a typical package. When the light-emitting element is packaged and used, it is not necessary to separately inject a phosphor into the cup of the package body, and it is possible to obtain uniform color temperature with respect to the overall light emission direction.

Figure 39:
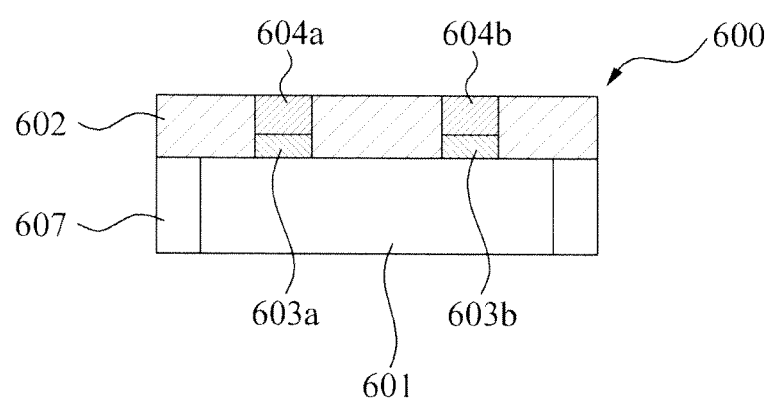
FIGS. 39 and 40 are cross-sectional views schematically illustrating light-emitting elements according to eighth and ninth examples, respectively.
Figure 40:
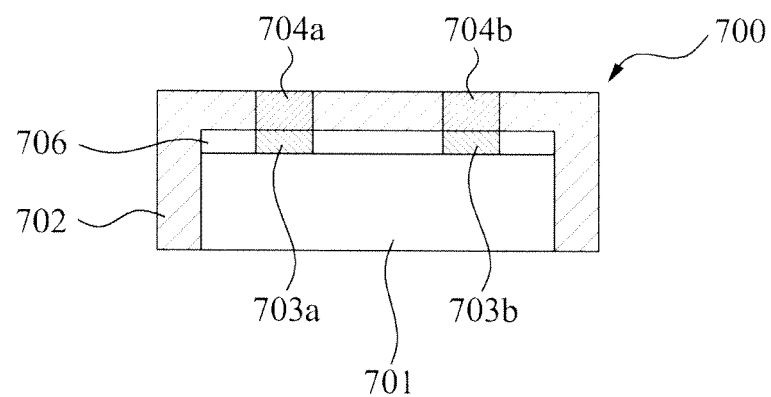

FIGS. 39 and 40 are cross-sectional views schematically illustrating light-emitting elements according to eighth and ninth examples, respectively. First, referring to FIG. 40, as in the seventh example, a light-emitting element 600 includes an LED chip 601 having first and second electrodes 603*a* and 603*b*, a wavelength conversion unit 602, and first and second electrical connection parts 604*a* and 604*b*. The difference of the light-emitting element 600 from the structure illustrated in FIG. 38 is that a resin unit 607 formed at the side surface of the LED chip 601 is formed of a transparent resin without a phosphor. The configuration is formed by considering light emitted to the side surface of the LED chip 601 has lower intensity than the light emitted to the first surface.

Next, a light-emitting element 700 illustrated in FIG. 40 includes an LED chip 701 having first and second electrodes 703*a* and 703*b*, a wavelength conversion unit 702, and first and second electrical connection units 704*a* and 704*b* as in the seventh example. The difference of the light-emitting element 700 from the structure illustrated in FIG. 38 is that an underfill resin unit 706, positioned on the first surface of the LED chip 701 and formed at a region surrounding the side surfaces of the first and second electrodes 703*a* and 703*b*, is formed of a transparent resin without a phosphor.

Meanwhile, referring to FIGS. 41 to 44, the structure of the wavelength conversion unit, in which a phosphor layer is stacked in a multi-layered form on a UV LED chip or on a blue LED chip, will be described through various exemplary examples.

Figure 41:
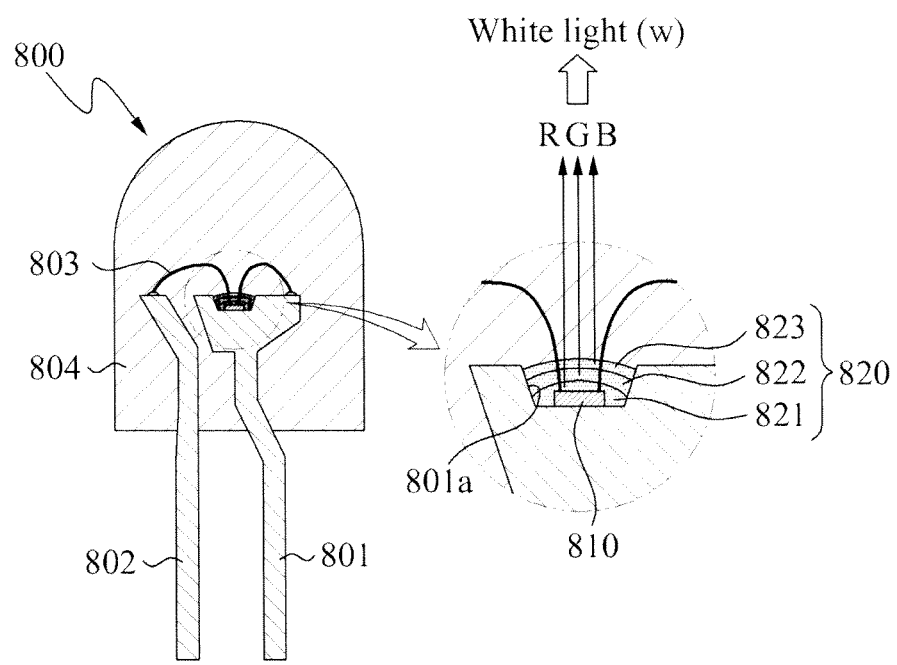
FIGS. 41 and 42 are cross-sectional views illustrating the structures of the light-emitting element packages according to fifth and sixth examples of the present invention, which are implemented in the form of a lamp and a chip, respectively.
Figure 42:
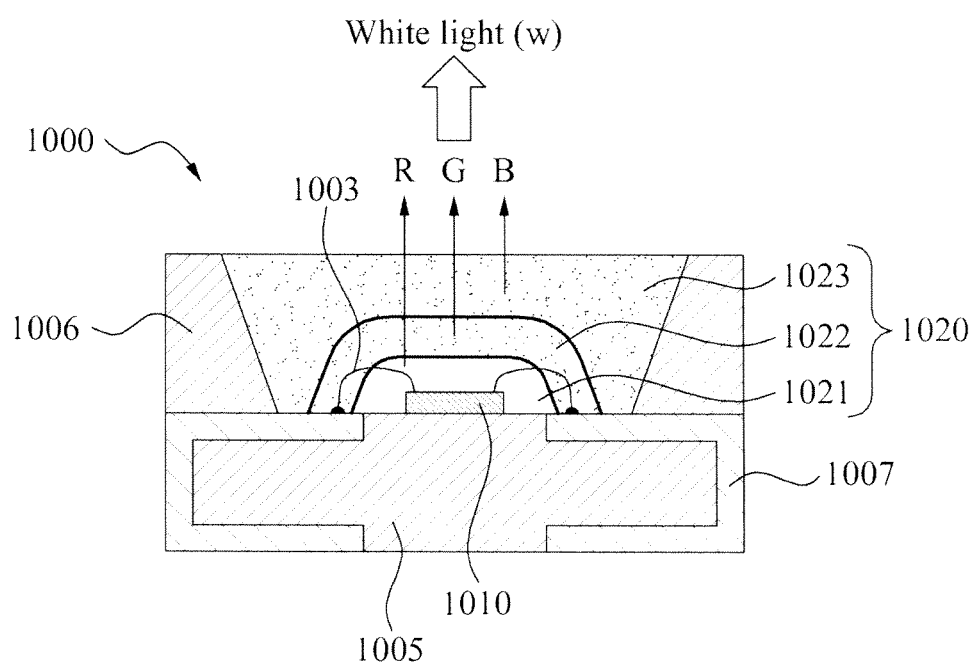

First, FIGS. 41 and 42 are cross-sectional views illustrating the structures of the light-emitting element packages according to second and third examples, which are implemented in the form of a lamp and a chip, respectively.

As illustrated in FIG. 41, in the light-emitting element package implemented in the form of a lamp according to a fifth example, a UV LED chip 810 having a wavelength of approximately 410 nm or less may be covered by a multi-layered fluorescent layer 820 including first, second, and third fluorescent layers 821, 822, and 823 containing three types of phosphors, which are excited by ultraviolet rays to emit light in different colors, respectively.

Moreover, as illustrated in FIG. 42, in a light-emitting element package implemented in the form of a chip according to the sixth example of the present application, a UV LED chip 1010 is installed within a groove of a casing 1006 on a substrate 1005. First, second, and third fluorescent layers 1021, 1022, and 1023 containing three types of fluorescent materials are formed within the groove of the casing 1006, and constitute a multi-layered fluorescent layer 1020 covering the UV LED chip 1010. An n electrode and a p electrode of the UV LED chip 1010 are electrically connected with a metal wire 1007 formed on the substrate 1005 by a wire 1003.

Specifically, the first fluorescent layer is formed on the UV LED chip and may be formed by mixing a phosphor emitting red light (R) and a resin. As the phosphor emitting red light (R), a fluorescent material which is excited by ultraviolet rays to emit light having a light emission peak in a range from 600 nm to 700 nm, that is, a phosphor including a compound synthesized according to Examples 1 to 3 of the application and expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element, is used.

The second fluorescent layer is stacked on the first fluorescent layer and may be formed by mixing a phosphor emitting green light (G) and a resin. As the phosphor emitting green light, a fluorescent material excited by ultraviolet rays to emit light having a wavelength in a range from 500 nm to 550 nm may be used. The third fluorescent layer is stacked on the second fluorescent layer, and may be formed by mixing a phosphor emitting blue light (B) and a resin. As the phosphor emitting blue light, a fluorescent material excited by ultraviolet rays to emit light having a wavelength in a range from 420 nm to 480 nm may be used.

Through such a configuration, the ultraviolet rays emitted from the UV LED chip excite the different kinds of phosphors contained in the first, second, and third fluorescent layers. Accordingly, red light (R), green light (G), and blue light (B) are emitted from the first, second, and third fluorescent layers, respectively, and light beams of the three respective colors are combined to form white light (w).

In particular, the fluorescent layer for converting ultraviolet rays into fluorescence is formed of multiple layers, that is, three layers in which a first fluorescent layer emitting light of the longest wavelength, that is, red light (R) is first stacked on the UV LED chip, and second and third fluorescent layers emitting light at shorter wavelengths, that is, green light (G) and blue light (B) are sequentially stacked thereon. In this manner, since the first fluorescent layer containing a phosphor emitting red light (R) having the lowest light conversion efficiency is positioned to be closest to the UV LED chip, the light conversion efficiency at the first fluorescent layer may be relatively increased, thereby enhancing the overall light conversion efficiency of the LED chip.

Figure 44:
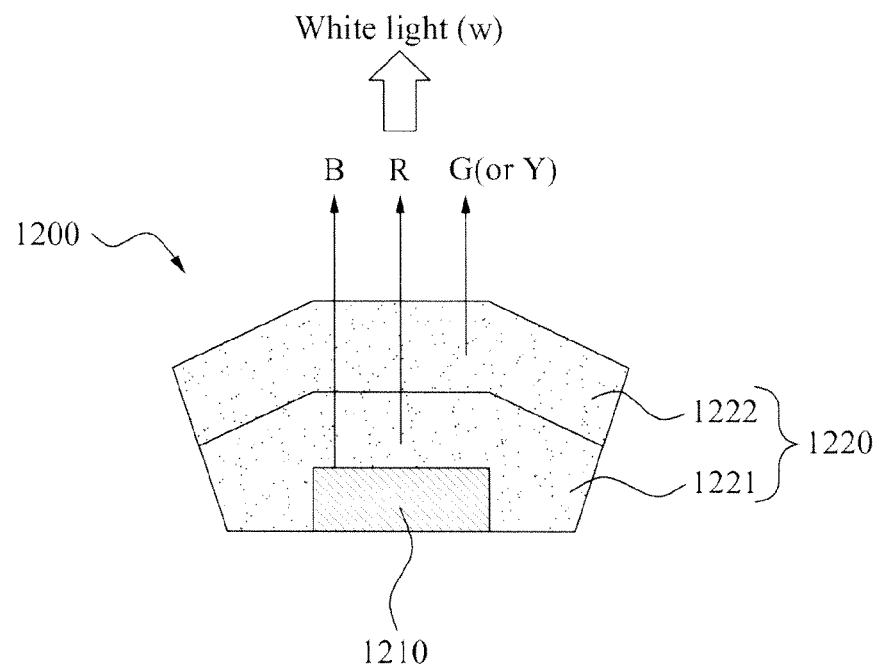

Next, FIGS. 43 and 44 illustrate partial structures of the light-emitting element packages according to seventh and eighth examples. These drawings illustrate only the structures of an LED chip and a multi-layered fluorescent layer, and the other configurations are the same as those of FIGS. 41 and 42.

That is, the light-emitting element packages according to the seventh and eighth examples may also be implemented in the form of a lamp or a chip.

The light-emitting element package according to the seventh example illustrated in FIG. 43 includes a multi-layered fluorescent layer 1120 formed to cover a UV LED chip 1110 having a wavelength of 410 nm or less, and in this case, the multi-layered fluorescent layer 1120 is formed as a two-layered fluorescent layer. Specifically, a first fluorescent layer 1121 formed on the UV LED chip 1110 is formed by mixing a phosphor emitting red light (R) and a resin. At this time, a phosphor emitting red light (R) is formed by together mixing a fluorescent material excited by ultraviolet rays to emit light having a light emission peak in a range from 600 nm to 700 nm, that is, a phosphor including a compound synthesized according to Examples 1 to 3 of the present invention and expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element.

Through such a configuration, ultraviolet rays emitted from the UV LED chip excite the phosphor contained in the first fluorescent layer 1121 to emit red light (R) and excite the two types of phosphors mixed in the second fluorescent layer 1122 to emit green light (G) and blue light (B). As the light beams of the three respective colors are combined, white light (w) is seen by human eyes. As described above, the fluorescent layer for converting ultraviolet rays into fluorescence is formed with two layers, in which the first fluorescent layer 1121 emitting red light (R) having the longest wavelength is first stacked on the UV LED chip 1110, and then the second fluorescent layer 1122 together emitting green light (G) and blue light (B) having a shorter wavelength is stacked thereon. Even by this stacking structure of the multi-layered fluorescent layer, it is possible to obtain an effect that light conversion efficiency is increased as in the above-described examples.

A light-emitting element package according to the eighth example as illustrated in FIG. 44 includes two multi-layered fluorescent layers 1220 formed to cover an LED chip 1210 emitting blue light (B) having a wavelength in a range from 420 nm to 480 nm as an excitation light, and in this case, a first fluorescent layer 1221 to be formed on the LED chip 1210 is formed by mixing a phosphor emitting red light (R) and a resin. At this time, the phosphor emitting red light (R) uses a fluorescent material excited by blue light to emit light having a light emission peak in a range from 600 nm to 700 nm, that is, a phosphor including a compound synthesized according to Examples 1 to 3 of the present application and expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element. Moreover, a second fluorescent layer 1222 to be stacked on the first fluorescent layer 1221 is formed by mixing a phosphor emitting green light (G) or yellow light (Y) and a resin.

Through such a configuration, blue light (B) emitted from the LED chip excites the phosphor contained in the first fluorescent layer to emit red light (R) and excites the phosphor contained in the second fluorescent layer to emit green light (G) or yellow light (Y). In this manner, the red light (R) and green light (G) (or yellow light (Y)) emitted from the multi-layered fluorescent layer and blue light (B) generated from the LED chip are combined to form white light (w).

Here, the white light emission principle of the light-emitting element package according to the eighth example of the present application disclosed in FIG. 44 will be described in more detail.

Figure 45:
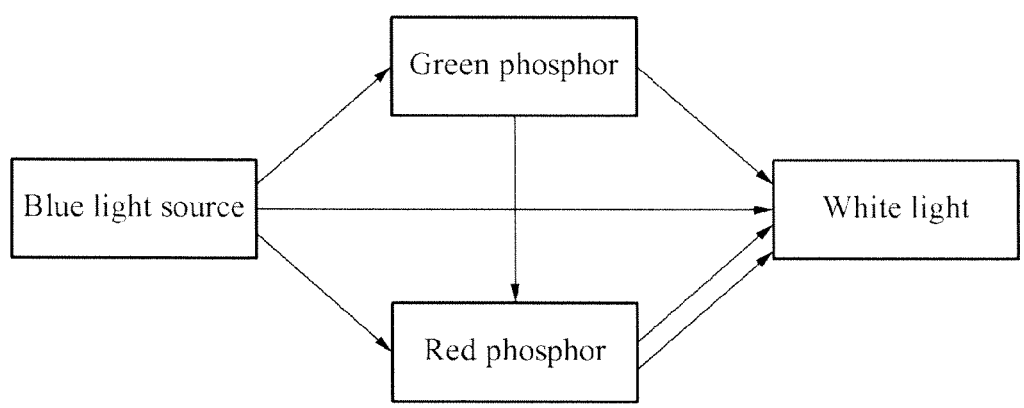
FIG. 45 is a conceptual view schematically illustrating a light-emitting element package according to the eighth example illustrated in FIG. 44.

FIG. 45 is a conceptual view schematically illustrating a light-emitting element package according to the eighth example of the present application illustrated in FIG. 44. Referring to FIG. 45, blue light is emitted from a blue light source. The blue light source has a peak emission wavelength in a range from 420 nm to 480 nm. In particular, as the blue light source, a blue LED having a peak emission wavelength in a range from 420 nm to 480 nm may be used.

Green and red phosphors are excited by the blue light emitted from the blue light source to emit green and red visible light, respectively. The emitted green and red visible light is mixed with blue light (the light emitted from the blue light source), which has transmitted through the phosphor, to output white light.

The green phosphor has a peak emission wavelength in a range from 490 nm to 550 nm and the red phosphor uses a fluorescent material excited by blue light to emit light having a light emission peak in a range from 600 nm to 700 nm, that is, a phosphor including a compound synthesized according to Examples 1 to 3 of the present application and expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element. Preferably, the phosphors have a high photon efficiency at a specific emission wavelength of the blue light source. Furthermore, preferably, each phosphor has significant transmittance for visible light emitted by another phosphor. The red phosphor is excited by light emitted by the green phosphor (green light), as well as excited by blue light emitted by the blue light source, to emit red light. Preferably, the red phosphor has a peak excitation wavelength in a range from 420 nm to 500 nm so as to be sufficiently efficiently excited by blue light and green light.

Further, because the red phosphor is excited by the green phosphor as well as the blue light source (that is, the red phosphor is doubly excited), the quantum yield of the red phosphor is improved. The overall luminous efficiency, luminance and color rendering index are also improved by the improvement in quantum yield of the red phosphor. In addition, when green light (for example, green emitted light discharged to the rear side of the light exit surface), which is left unused in the related art is used to excite the red phosphor, the overall luminous efficiency may be further increased. The overall luminance and color rendering index of the white light-emitting device may be improved by the increase in the quantum yield.

Figure 46:
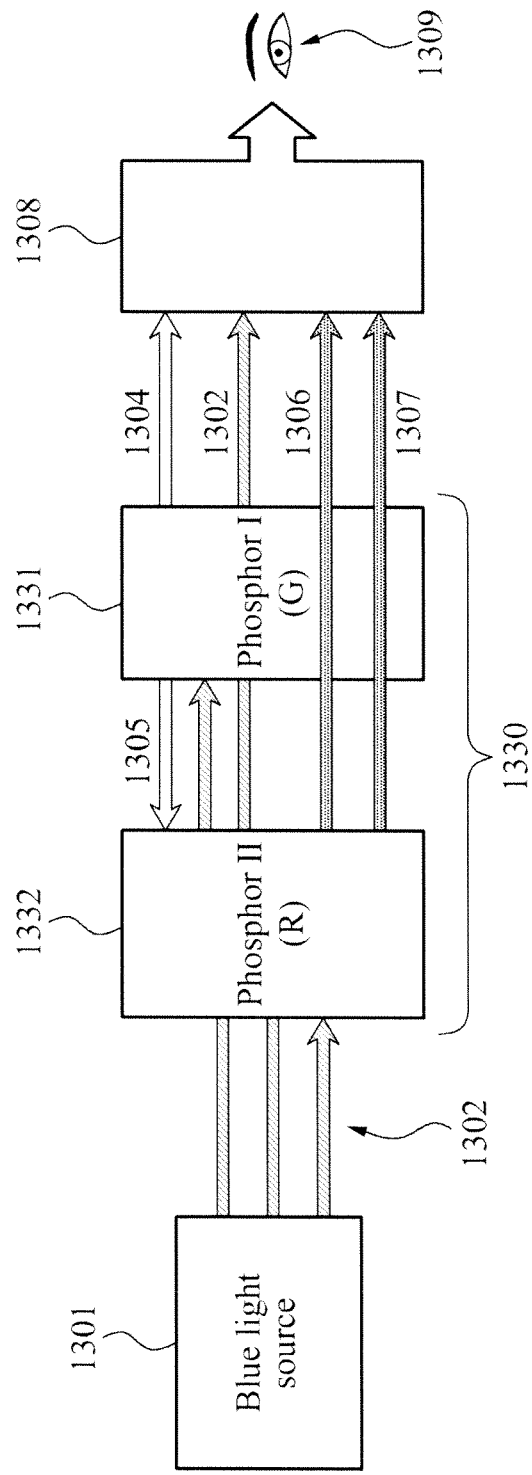
FIG. 46 is a schematic view for describing the operation principle of the light-emitting element package according to the eighth example in more detail.

FIG. 46 is a schematic view for describing the operation principle of a light-emitting element package according to an eighth example in more detail. Referring to FIG. 46, blue light 1302 is emitted by a blue light source 1301 such as a blue LED and is incident on phosphors 1330, that is, a second phosphor 1331 and a first phosphor 1332. It is preferred that the phosphors 1330 are formed to have layered structures separated from each other. This is because the use of phosphors of the separated layered structures is more suitable for efficiently using emission light emitted to the rear side of the light exit surface than the use of a mixture of the phosphors.

The blue light 1302 emitted from the blue light source 1301 is detected by the naked eyes and may have a wavelength, for example, in a range from 420 nm to 480 nm. Preferably, the blue light source 1301 is a blue LED having a peak emission wavelength in a range from 420 nm to 480 nm. The second phosphor 1331 absorbs the blue light 1302, and then emits green light 1304 and 1305 having a peak emission wavelength in a range from 490 nm to 550 nm. The first phosphor 1332 absorbs the blue light 1302 and the light (the green light 1305) emitted from the second phosphor 1331, and then emits red light 1306 and 1307 having a light emission peak in a range from 600 nm to 700 nm. In particular, when the first phosphor 1332 has a peak excitation wavelength in a range from 420 nm to 500 nm, the first phosphor 1332 may effectively absorb the blue light 1302 and the green light 1305 (that is, may be effectively excited by the blue light 1302 and the green light 1305). The red light 1306 is red light emitted by the first phosphor 1332 due to the absorption of the light 1305 emitted from the second phosphor 1331. The red light 1307 is red light emitted by the first phosphor 1332 due to the absorption of the light 1302 emitted from the blue light source 1301. An observer 1309 perceives the combination of the green light 1304, the blue light 1302, and the red light beams 1306 and 1307 as white light 1308.

As described above, the first phosphor 1332 is doubly excited by the blue light source 1301 and the second phosphor 1331 to emit red light. Accordingly, the quantum yield of the red phosphor (the first phosphor 1332) is improved. Thus, the overall luminance of the light-emitting device is increased and the color rendering index is enhanced. The second phosphor 1331 may be any phosphor as long as the phosphor emits green light having a peak emission wavelength in a range from 490 nm to 550 nm in response to the light 1302 emitted from the blue light source 1301. When a blue LED having a peak emission wavelength in a range from 420 nm to 480 nm is used as the blue light source 1301, the second phosphor 1331 may use a phosphor having a peak emission wavelength in a range from 490 nm to 550 nm having a high quantum efficiency for the light emitted from the blue LED (the blue light having a peak emission wavelength in a range from 420 nm to 480 nm).

The first phosphor 1332 uses a fluorescent material which emits light having a light emission peak in a range from 600 nm to 700 nm in response to the light 1302 emitted from the blue light source 1301 and the light 1305 emitted from the second phosphor 1331, that is, a phosphor including a compound synthesized according to Examples 1 to 3 of the present application and expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element. Preferably, the first phosphor 1332 may absorb light emitted from the second phosphor 31 in a range from 490 nm to 550 nm as well as the blue LED light in a range from 420 nm to 480 nm to emit red light having a light emission peak in a range from 600 nm to 700 nm. The phosphors may be doubly excited by the blue light 2 and the green light 5. Accordingly, the quantum yield of the red phosphor (first phosphor 32) is increased, and the overall luminous efficiency, luminance, and color rendering index are enhanced.

Figure 47:
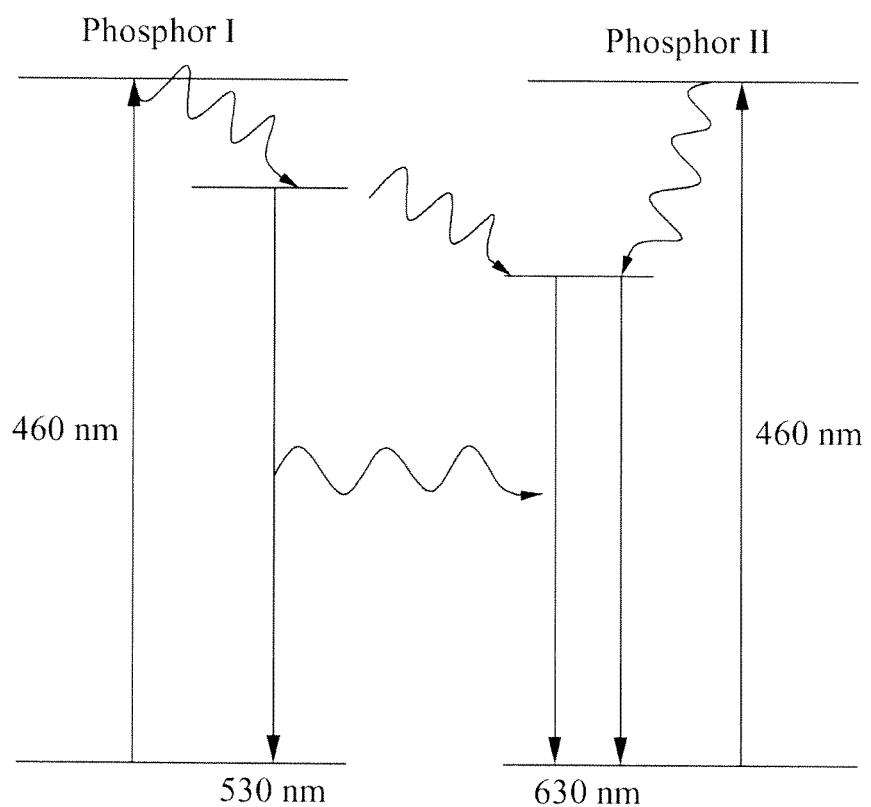
FIG. 47 is a schematic view schematically illustrating energy transfer between a green phosphor (a second phosphor) and a red phosphor (a first phosphor), which are used in the light-emitting element package of the eighth example.

FIG. 47 is a schematic view schematically illustrating energy transfer between a green phosphor (a second phosphor) and a red phosphor (a first phosphor), which are used in the light-emitting element package of the eighth example of the present application. Referring to FIG. 47, the second phosphor is excited by blue light of about 460 nm to emit green light of about 530 nm. Furthermore, the first phosphor absorbs a portion of the light (green light) emitted from the first phosphor as well as the blue light of about 460 nm to emit red light of about 620 nm. In this manner, the first phosphor is doubly excited so as to emit red light. That is, the first phosphor 1332 is disposed on the blue light source 1301 such as the blue LED and the like, and the second phosphor 1331 is disposed on the first phosphor 1332. With such a structure, the light 1305 emitted to the rear side from the second phosphor 1331 is easily absorbed by the first phosphor 1332 to emit the red light 1306. Accordingly, the additional light 1306 emitted from the first phosphor 1332 further increases the overall luminance of the light-emitting device and further improves the color rendering index. Further, the light 1305 discharged to the rear side, which is wasteful, is effectively used by the first phosphor 1332. The disposition of the phosphors in the layered structure may be easily implemented by forming layers of a molded resin in which each phosphor is distributed.

Figure 48:
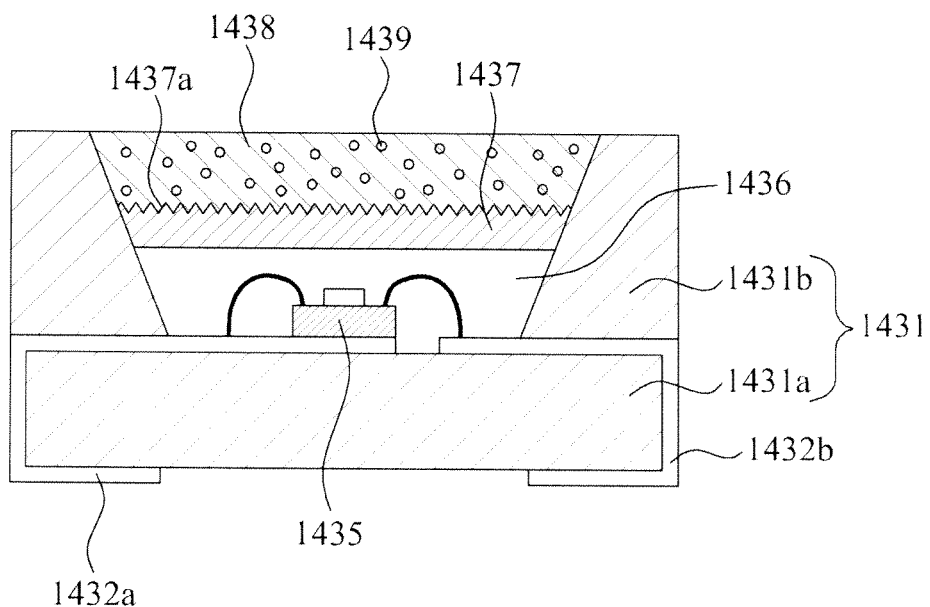
FIG. 48 is a cross-sectional view illustrating a light-emitting element package according to a ninth example.

FIG. 48 is a cross-sectional view illustrating a light-emitting element package according to a ninth example. Referring to FIG. 48, a light-emitting element package 1430 includes a package substrate 1431 and an LED chip 1435 mounted on the package substrate 1431. The package substrate 1431 may include a lower package substrate 1431a with two lead frames 1432a and 1432b formed thereon and an upper package substrate 1431b including a cavity. The LED chip 1435 is mounted in the cavity region. Both electrodes (not illustrated) of the LED chip 1435 are connected to upper ends of the lead frames 1432a and 1432b by wires, respectively.

A low refractive index region 1436 is provided to surround the LED chip 1435. The low refractive index region 1436 may be an empty space, but may be a region filled with a transparent resin having a relatively low refractive index. When the low refractive index region 1436 is an empty space, the region has a refractive index (n=1) similar to that of the atmosphere. In addition, when the low refractive index region 1436 is formed with a transparent resin, a typical epoxy, silicone, or a mixture resin thereof may be used. In this case, the refractive index of the low refractive index region 1436 may be approximately 1.7.

A high refractive index layer 1437 is formed on the low refractive index region 1436. The high refractive index layer 1437 at least has a higher refractive index than that of the low refractive index region 1436 and includes a pattern of protrusions and depressions 1437a formed on an upper surface thereof. Furthermore, a wavelength conversion layer 1438 including a phosphor 1439 for converting the wavelength of light emitted from the LED 1435 is formed on the high refractive index layer 1437. The wavelength conversion layer 1438 is a phosphor-contained resin layer and has a refractive index at least lower than that of the high refractive index layer 1437.

The wavelength conversion layer 1438 at least includes a red phosphor including a compound synthesized according to Examples 1 to 3 of the present invention and expressed in the composition formula: $A_z(Sr, M)_2(Si, Al)O_{4-x}N_y:R$ ($0<x<3$, $y=2x/3$, $0.001<z<0.1$), where A is at least one element selected from a group consisting of lithium (Li), potassium (K), and sodium (Na), M is at least one element selected from a group consisting of barium (Ba), magnesium (Mg), and calcium (Ca), and R is at least one element selected from a group consisting of lanthanide and a transition metal element.

The high refractive index layer 1437 adopted in the present application may be formed of a resin having a high refractive index by itself or may be implemented as a typical transparent resin layer containing high refractive index particles. In this case, the high refractive index particles may be selected from a group consisting of GaP, Si, $TiO_2$, $SrTiO_3$, SiC, cubic or amorphous carbon, carbon nanotubes, AlGaInP, AlGaAs, SiN, SiON, ITO, SiGe, AlN, and GaN.

The high refractive index layer 1437 has a high refractive index such that photons scattered from the phosphor particles 1439 may be totally reflected from the interface with the low refractive index region 1436. It is preferred that the high refractive index layer 1437 is formed to have a refractive index of 1.8 or more, but when the low refractive index region 1436 is formed of a resin having a specific refractive index, the high refractive index layer 1437 may be formed of a material having a sufficiently higher refractive index to make a significant difference in the refractive index from that of the specific resin.

Although the interface with the wavelength conversion layer 1438 has a relatively high light extraction critical angle, light extraction to the wavelength conversion layer 1438 is more easily realized by the pattern of protrusions and depressions 1437a formed on the high refractive index layer 1437. Preferably, a formation period of the protrusions and depressions 1437a may be in a range from about 0.001 μm to about 500 μm. Further, when the difference between the refractive index of the high refractive index layer 1437 and that of the wavelength conversion layer 1438 is too great, it is difficult to expect sufficient light extraction even by the protrusions and depressions 1437a, and thus the refractive index of the high refractive index layer 1437 is preferably 10 or less.

Figure 49:
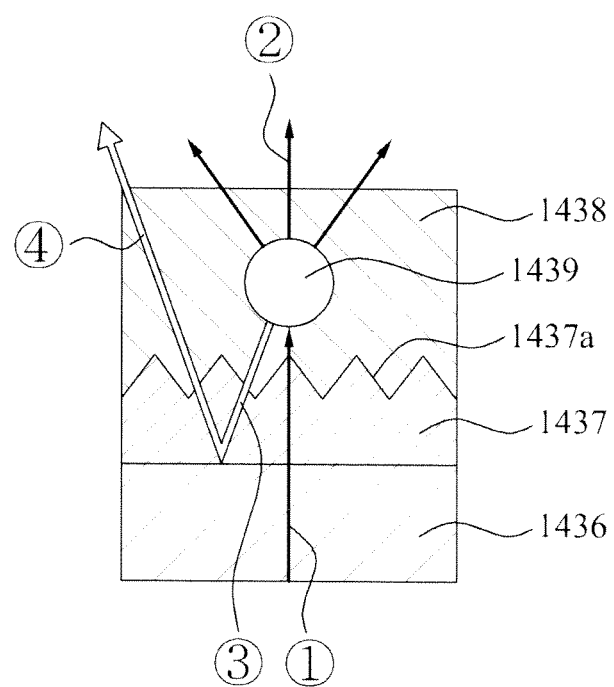
FIG. 49 is a schematic view for describing a mechanism of extracting light from the light-emitting element package according to the ninth example in FIG. 48.

FIG. 49 is a schematic view for describing a mechanism of extracting light from the light-emitting package according to the ninth example illustrated in FIG. 48. Referring to FIGS. 48 and 49, light emitted from the LED chip 1435 passes through the low refractive index region 1436 and the high refractive index layer 1437 and proceeds to the wavelength conversion layer 1438. Typically, the low refractive index region 1436 has a lower refractive index than nitride constituting the LED chip 1435, but the pattern of the protrusions and depressions (not illustrated) is formed on the LED surface, and thus light generated from the LED 1435 may be effectively extracted to the low refractive index region 1436. In addition, light going toward the high refractive index layer 1437 from the low refractive index region 1436 proceeds to a high refractive index material, and thus may be effectively extracted. The wavelength conversion layer 1438 has a lower refractive index than that of the high refractive index layer, and thus has a limited light extraction critical angle, but light may be effectively extracted by the protrusions and depressions formed on the upper surface of the high refractive index layer.

Subsequently, the light emitted from the LED is excited at the phosphor particles 1439, and a portion of the excited light may be extracted in a desired direction, that is, toward the upper portion of the package. Meanwhile, another portion of the excited light may proceed from the wavelength conversion layer 1438 to the high refractive index layer 1437 toward the interior of the package. Since the wavelength conversion layer 1438 has a lower refractive index than that of the high refractive index layer 1437, the light that proceeds toward the interior of the package may enter the high refractive index layer 1437 without being substantially lost. Most of the light that has entered the high refractive index layer is totally reflected from the interface with the low refractive index region 1436 due to a large difference in the refractive index. The totally reflected light proceeds to an upper portion of the high refractive index layer 1437 and may pass through the interface between the high refractive index layer 1437 and the wavelength conversion layer 1438 to be extracted in a desired direction. As described above, the high refractive index layer 1437 and the wavelength conversion layer 1438 have a limited light extraction critical angle at the interface thereof due to a difference in the refraction indices thereof, but light may be easily extracted by the protrusions and depressions 1437a formed on the upper surface of the high refractive index layer 1437.

In this manner, the light scattered by the phosphor particles 1439 and proceeding to the interior of the package may be effectively totally reflected in a desired upward direction by the high refractive index layer 1437 with the protrusions and depressions 1437a formed thereon and the low refractive index region 1436.

In the present application, since the wavelength conversion layer containing phosphor particles is disposed at the upper portion thereof and the optical structure including the high refractive index layer with a surface of the protrusions and depressions formed therebelow and the low refractive index region is introduced at the lower portion of the wavelength conversion layer is introduced, the proceeding direction of light scattered in every direction from the phosphor particles may be readjusted to the upward direction such that the light extraction efficiency is enhanced.

Although the present application has been described by limited examples and drawings as described above, the present application is not limited to the examples, and it will be apparent to those skilled in the art to which the present application pertains that various modifications and variations may be made from the description.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The invention claimed is:

1. A red phosphor comprising:
   a compound expressed in a composition formula:
   $A_z(Sr, M)_2(Si, Al)O_{4-x}N_y:R (0<x<3, y=2x/3, 0.001<z<0.1)$, where:
   A is at least one element selected from a group consisting of lithium (Li), potassium (K), and sodium (Na),
   M is at least one element selected from a group consisting of barium (Ba), magnesium (Mg), and calcium (Ca), and
   R is at least one element selected from a group consisting of lanthanide and a transition metal element.

2. The red phosphor of claim 1, wherein A is sodium (Na), and M is calcium (Ca).

3. The red phosphor of claim 1, wherein:
   the compound expressed as $A_z(Sr, M)_2(Si, Al)O_{4-x}N_y:R$ $(0<x<3, y=2x/3, 0.001<z<0.1)$ comprises a host material having a crystal phase, and
   A is comprised as a dopant material or activator in the compound.

4. The red phosphor of claim 1, wherein:
   the compound expressed as $A_z(Sr, M)_2(Si, Al)O_{4-x}N_y:R$ $(0<x<3, y=2x/3, 0.001<z<0.1)$ comprises a host material having a crystal phase, and
   A and aluminum (Al) is comprised as a dopant material or activator in the compound.

5. The red phosphor of claim 1, wherein the red phosphor has a light emission peak at a wavelength band from 600 nm to 700 nm by using a blue or ultraviolet wavelength region as an excitation source.

6. The red phosphor of claim 1, wherein R is europium (Eu) or dysprosium (Dy).

7. The red phosphor of claim 1, wherein a spectrum half bandwidth of a light emission wavelength of the red phosphor is from 83 nm to 150 nm.

8. The red phosphor of claim 1, wherein a crystal structure of the red phosphor is an orthorhombic crystal structure.

9. A method for preparing a red phosphor, the method comprising steps of:
   mixing raw materials comprising at least one compound of an Sr-containing compound and an M-containing compound, an A-containing compound, an Eu-containing compound, an Al-containing compound, an Si-containing oxide, and an Si-containing nitride;
   sintering the mixture to obtain a compound expressed in a composition formula: $A_z(Sr, M)_2(Si, Al)O_{4-x}N_y:Eu$ $(0<x<3, y=2x/3, 0.001<z<0.1)$; and
   crushing and milling the sintered compound,
   where A is at least one element selected from a group consisting of lithium (Li), potassium (K), and sodium (Na), and M is at least one element selected from a group consisting of barium (Ba), magnesium (Mg) and calcium (Ca).

10. The method of claim 9, wherein the sintering step and the milling/crushing step are performed twice, respectively.

11. The method of claim 9, wherein the Eu-containing compound is europium oxide ($Eu_2O_3$).

12. The method of claim 9, wherein the mixing step further comprises mixing manganese carbonate.

13. The method of claim 9, wherein the Sr-containing compound comprises a metal, a water soluble metal salt, an oxide, a nitrate, an oxide salt, a sulfate, or a carbonate of strontium (Sr).

14. The method of claim 9, wherein the M-containing compound comprises a metal, a water soluble metal salt, an oxide, a nitrate, an oxide salt, a sulfate, or a carbonate of M.

15. The method of claim 9, wherein the Si-containing oxide is silicon oxide ($SiO_2$), and the Si-containing nitride is silicon nitride ($Si_3N_4$).

16. The method of claim 9, wherein the mixing step further comprises: wet mixing the raw materials with a solvent.

17. The method of claim 9, further comprising the step of: drying the mixture subjected to the mixing step.

18. The method of claim 9, wherein the sintering step is performed in a temperature range from 1,000° C. to 1,800° C. for 1 to 24 hours.

19. The method of claim 9, wherein the sintering step is performed under a nitrogen gas atmosphere.

20. A light-emitting device comprising:
a light-emitting element emitting excitation light; and
a wavelength conversion unit absorbing the excitation light to emit visible light,
wherein the wavelength conversion unit comprises:
a compound expressed in a composition formula: $A_z(Sr, M)_2(Si, Al)O_{4-x}N_y:R(0<x<3, y=2x/3, 0.001<z<0.1)$, where:
  A is at least one element selected from a group consisting of lithium (Li), potassium (K) and sodium (Na),
  M is at least one element selected from a group consisting of barium (Ba), magnesium (Mg), and calcium (Ca), and
  R is at least one element selected from a group consisting of lanthanide and a transition metal element.

21. The light-emitting device of claim 20, wherein the red phosphor emits a light emission peak at a wavelength band from 600 nm to 700 nm by using a blue or ultraviolet wavelength range as an excitation source.

22. The light-emitting device of claim 20, wherein the light-emitting element is an ultraviolet light-emitting diode or blue light-emitting diode.

23. The light-emitting device of claim 20, wherein:
the light-emitting device comprises at least one phosphor selected from a group consisting of a blue phosphor, a green phosphor, and a yellow phosphor, and
final output light of the light-emitting device is white light.

24. The light-emitting device of claim 20, wherein the wavelength conversion unit comprises:
a multilayered structure which is formed on an upper portion of the light-emitting element and
at least two phosphor layers comprising phosphors different from each other.

25. The light-emitting device of claim 24, wherein:
the phosphor is at least one selected from a group consisting of a blue phosphor, a green phosphor, and a yellow phosphor, and
final output light of the light-emitting device is white light.

26. The light-emitting device of claim 20, wherein the wavelength conversion unit is formed such that an outer surface of the light-emitting element is uniformly covered with a resin comprising the red phosphor.

27. The light-emitting device of claim 26, wherein the wavelength conversion unit is formed only on an upper surface of the light-emitting element, or on upper and side surfaces thereof.

28. The light-emitting device of claim 20, wherein:
the wavelength conversion unit further comprises a resin packaging unit encapsulating the light-emitting element, and
the red phosphor is dispersed in the resin packaging unit.

29. The light-emitting device of claim 28, wherein:
the wavelength conversion unit comprises at least two phosphors selected from a group consisting of a blue phosphor, a green phosphor, and a yellow phosphor, and
final output light of the light-emitting device is white light.

* * * * *